(12) United States Patent
Park

(10) Patent No.: US 10,615,124 B2
(45) Date of Patent: *Apr. 7, 2020

(54) THREE-DIMENSIONAL SEMICONDUCTOR DEVICE INCLUDING A CELL ARRAY REGION AND A CONTACT REGION

(71) Applicant: Samsung Electronics Co., Ltd., Suwon-si (KR)

(72) Inventor: Hyun-mog Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/508,443

(22) Filed: Jul. 11, 2019

(65) Prior Publication Data

US 2019/0333855 A1 Oct. 31, 2019

Related U.S. Application Data

(63) Continuation of application No. 15/855,289, filed on Dec. 27, 2017, now Pat. No. 10,396,035.

(30) Foreign Application Priority Data

Jul. 26, 2017 (KR) .................. 10-2017-0094960

(51) Int. Cl.
*H01L 27/11582* (2017.01)
*H01L 23/535* (2006.01)
(Continued)

(52) U.S. Cl.
CPC ...... *H01L 23/535* (2013.01); *H01L 21/76805* (2013.01); *H01L 21/76816* (2013.01);
(Continued)

(58) Field of Classification Search
CPC ......... H01L 27/11582; H01L 27/11556; H01L 27/1157; H01L 27/11578; H01L 27/11524;
(Continued)

(56) References Cited

U.S. PATENT DOCUMENTS 6,197,633 B1 3/2001 Schindler et al.
8,013,383 B2 9/2011 Kidoh et al.
(Continued)

FOREIGN PATENT DOCUMENTS

JP 2011-035237 2/2011
KR 10-2015-0051841 5/2015
(Continued)

*Primary Examiner* — Khiem D Nguyen
(74) *Attorney, Agent, or Firm* — Muir Patent Law, PLLC

(57) ABSTRACT

A three-dimensional semiconductor device includes: a substrate having a cell array region and a contact region; a stacked structure including a plurality of electrodes and a plurality of electrode isolation insulating layers, which are alternately stacked on the substrate in a vertical direction, and having a stepwise structure on the contact region; vertical structures penetrating the stacked structure in the cell array region, each of the vertical structures constituting a cell string; and word line contact plugs, each penetrating an uppermost electrode among the plurality of electrodes in a region of each of tread portions of the stacked structure having the stepwise structure, being connected to another electrode under the penetrated uppermost electrode, and being electrically insulated from the penetrated uppermost electrode.

18 Claims, 29 Drawing Sheets

(51) Int. Cl.
  *H01L 29/06* (2006.01)
  *H01L 27/11556* (2017.01)
  *H01L 27/11575* (2017.01)
  *H01L 21/768* (2006.01)
  *H01L 27/11573* (2017.01)

(52) U.S. Cl.
  CPC .. *H01L 21/76831* (2013.01); *H01L 27/11556* (2013.01); *H01L 27/11575* (2013.01); *H01L 27/11582* (2013.01); *H01L 29/0649* (2013.01); H01L 27/11573 (2013.01)

(58) Field of Classification Search
  CPC ............. H01L 29/7926; H01L 29/7889; H01L 29/66833; H01L 29/66666; H01L 27/11575; H01L 21/76805
  See application file for complete search history.

(56) References Cited

U.S. PATENT DOCUMENTS

| | | | |
|---|---|---|---|
| 8,822,285 B2 | 9/2014 | Hwang et al. | |
| 9,419,013 B1 | 8/2016 | Lee et al. | |
| 9,484,355 B2 | 11/2016 | Jung et al. | |
| 10,396,035 B2* | 8/2019 | Park | H01L 21/76805 |
| 2009/0212350 A1* | 8/2009 | Kidoh | H01L 27/0688 |
| | | | 257/324 |
| 2009/0267135 A1* | 10/2009 | Tanaka | H01L 27/115 |
| | | | 257/324 |
| 2011/0031630 A1 | 2/2011 | Hashimoto | |
| 2011/0169071 A1* | 7/2011 | Uenaka | H01L 27/105 |
| | | | 257/326 |
| 2011/0284943 A1 | 11/2011 | Hwang et al. | |
| 2012/0061744 A1* | 3/2012 | Hwang | H01L 27/11565 |
| | | | 257/324 |
| 2012/0077320 A1 | 3/2012 | Shim et al. | |
| 2012/0108048 A1 | 5/2012 | Lim et al. | |
| 2013/0043509 A1 | 2/2013 | Cho et al. | |
| 2014/0166963 A1* | 6/2014 | Lee | H01L 21/02532 |
| | | | 257/4 |
| 2015/0069496 A1 | 3/2015 | Shiga | |
| 2015/0137205 A1* | 5/2015 | Kim | H01L 29/7889 |
| | | | 257/314 |
| 2015/0179564 A1 | 6/2015 | Lee et al. | |
| 2015/0255385 A1 | 9/2015 | Lee et al. | |
| 2015/0287710 A1 | 10/2015 | Yun et al. | |
| 2015/0349109 A1 | 12/2015 | Lee | |
| 2015/0372005 A1 | 12/2015 | Yon et al. | |
| 2016/0027730 A1 | 1/2016 | Lee | |
| 2016/0027796 A1 | 1/2016 | Yang et al. | |
| 2016/0172371 A1 | 6/2016 | Kim | |
| 2017/0077026 A1* | 3/2017 | Okawa | H01L 27/11556 |
| 2017/0084626 A1* | 3/2017 | Kim | H01L 23/485 |
| 2017/0200676 A1 | 7/2017 | Jeong et al. | |

FOREIGN PATENT DOCUMENTS

| | | |
|---|---|---|
| KR | 10-2015-0073251 | 7/2015 |
| KR | 10-2015-0104817 | 9/2015 |
| KR | 10-2016-0013756 | 2/2016 |
| KR | 10-2016-0024592 | 3/2016 |

* cited by examiner

THREE-DIMENSIONAL SEMICONDUCTOR DEVICE INCLUDING A CELL ARRAY REGION AND A CONTACT REGION

CROSS-REFERENCE TO RELATED APPICATIONS

This application is a continuation of U.S. patent application Ser. No. 15/855,289, filed Dec. 27, 2017, in the U.S. Patent and Trademark Office (USPTO), now U.S. Pat. No. 10,396,035, issued Aug. 27, 2019, which claims the benefit of priority under 35 U.S.C. § 119 to Korean Patent Application No. 10-2017-0094960, filed on Jul. 26, 2017, in the Korean Intellectual Property Office, the disclosure of which is incorporated herein in its entirety by reference.

BACKGROUND

The disclosed embodiments relate to a semiconductor device, and more particularly, to a three-dimensional (3D) semiconductor device including three-dimensionally arranged memory cells.

Along with decreasing sizes of semiconductor devices, the integration of two-dimensional (2D) semiconductor devices (or planar type semiconductor devices), in which a plurality of memory cells are two-dimensionally arranged, is reaching a limit. To overcome such an integration limit, although three-dimensional semiconductor devices (vertical type semiconductor devices), in which memory cells are three-dimensionally arranged, are proposed, more complicated and precise process control is required than in the case of two-dimensional semiconductor devices.

SUMMARY

The disclosed embodiments provide a three-dimensional semiconductor device, which may improve electrical connection reliability of three-dimensionally arranged memory cells and has structural stability.

According to aspects, the disclosure is directed to a three-dimensional semiconductor device comprising: a substrate having a cell array region and a contact region; a stacked structure comprising a plurality of electrodes and a plurality of electrode isolation insulating layers, which are alternately stacked on the substrate in a vertical direction, and having a stepwise structure on the contact region; vertical structures penetrating the stacked structure in the cell array region, each of the vertical structures constituting a cell string; and contact plugs in the contact region, wherein for each pair of immediately neighboring electrodes of the plurality of electrodes including an upper electrode and a lower electrode below the upper electrode, a corresponding one of the contact plugs contacts the lower electrode and penetrates and is electrically insulated from the upper electrode According to other aspects, the disclosure is directed to a three-dimensional semiconductor device comprising: a substrate having a cell array region, a contact region, and a dummy contact region between the cell array region and the contact region; a stacked structure comprising a plurality of electrodes and a plurality of electrode isolation insulating layers, which are alternately stacked on the substrate in a vertical direction, and having a stepwise structure on the contact region; contact plugs in the contact region; a dummy landing plug connected to an uppermost electrode of the plurality of electrodes in the dummy contact region; and a contact landing plug connected to each of the contact plugs, wherein for each pair of immediately neighboring electrodes of the plurality of electrodes including an upper electrode and a lower electrode below the upper electrode, a corresponding one of the contact plugs contacts the lower electrode and penetrates and is electrically insulated from the upper electrode.

According to other aspects, the disclosure is directed to a three-dimensional semiconductor device comprising: a substrate having a cell array region and a contact region; a stacked structure comprising a plurality of electrodes and a plurality of electrode isolation insulating layers, which are alternately stacked on the substrate in a vertical direction, and having a stepwise structure on the contact region, wherein ends of two lowermost electrodes among the plurality of electrodes in the contact region are vertically aligned with each other at the same position; vertical structures penetrating the stacked structure in the cell array region, each of the vertical structures constituting a cell string comprising a plurality of select transistors; and contact plugs in the contact region, wherein for each pair of immediately neighboring electrodes of the plurality of electrodes including an upper electrode and a lower electrode below the upper electrode, a corresponding one of the contact plugs contacts the lower electrode and penetrates and is electrically insulated from the upper electrode.

Since a word line contact plug penetrates one electrode and is connected to another electrode thereunder, the word line contact plug is supported by the penetrated electrode, whereby the three-dimensional semiconductor device may provide structural stability of the word line contact plug and secure electrical reliability.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
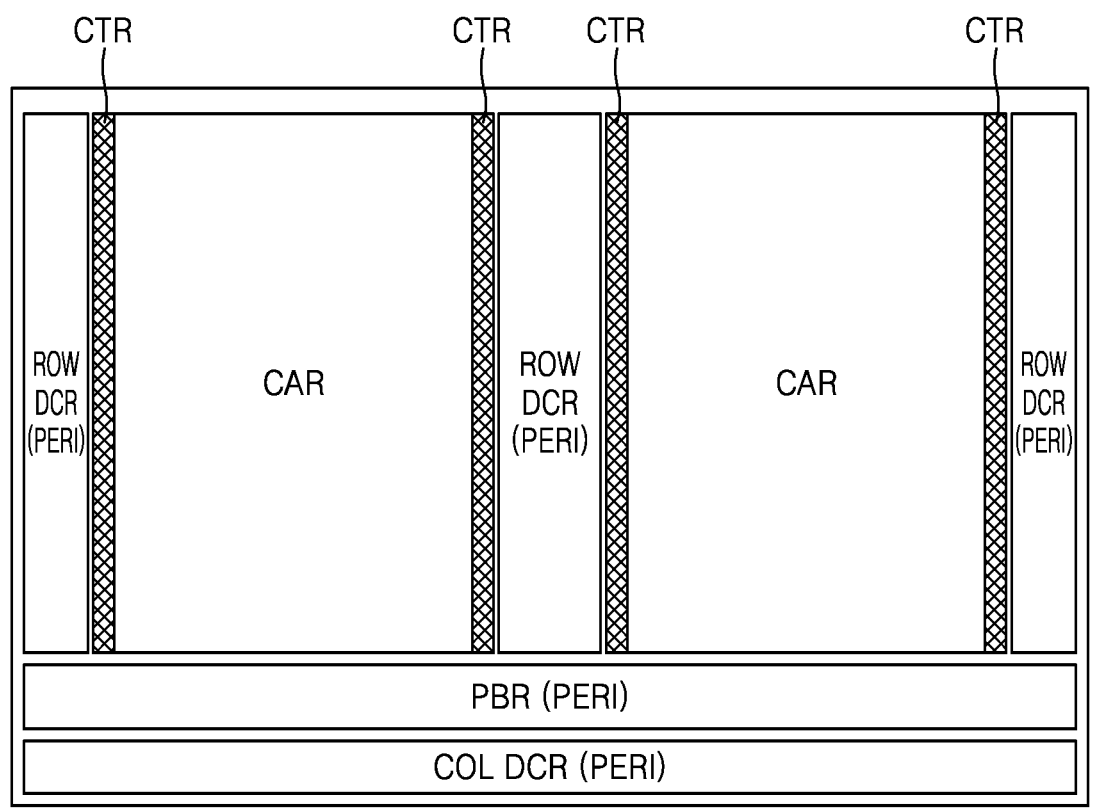
FIG. 1 is a plan view illustrating a schematic arrangement structure of a three-dimensional semiconductor device, according to an exemplary embodiment.
Figure 2:
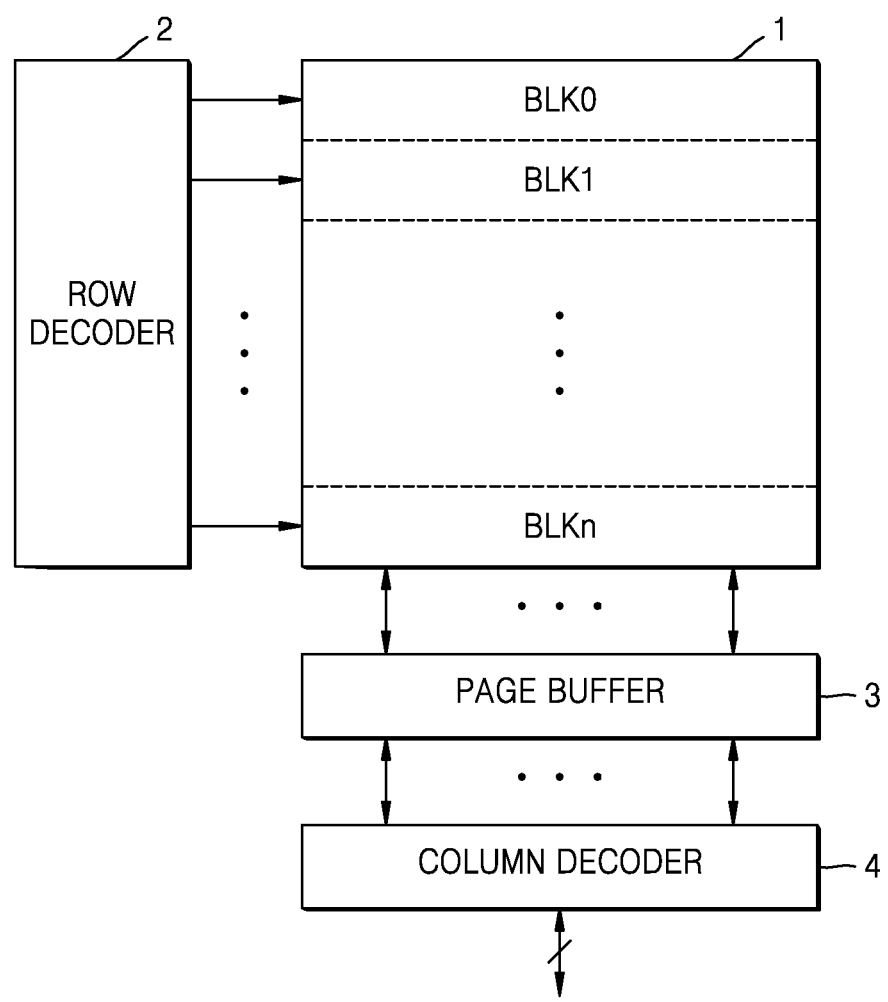
FIG. 2 is a block diagram illustrating the three-dimensional semiconductor device of FIG. 1.

FIG. 1 is a plan view illustrating a schematic of a three-dimensional semiconductor device according to an example embodiment, and FIG. 2 is a block diagram illustrating the three-dimensional semiconductor device according to the embodiment shown in FIG. 1.

Referring together to FIGS. 1 and 2, the three-dimensional semiconductor device may include a cell array region CAR and a peripheral circuit region PERI. The peripheral circuit region PERI may include row decoder regions ROW DCR, a page buffer region PBR, and a column decoder region COL DCR. A contact region CTR may be arranged between the cell array region CAR and the row decoder regions ROW DCR.

A three-dimensional memory cell array 1 including a plurality of memory cells may be arranged in the cell array region CAR. The memory cell array 1 may include the plurality of memory cells, and a plurality of word lines and a plurality of bit lines, which are electrically connected to the memory cells. In an embodiment, the memory cell array 1 may include a plurality of memory blocks BLK0 to BLKn, where each memory block BLK is a data erase unit (e.g., the smallest unit of memory that can be erased in a single erase operation). The memory cells of the three-dimensional memory cell array may be non-volatile memory cells, with vertically aligned groups of memory cells connected in series to form a string of memory cells (e.g., CSTR), which may form a 3D NAND Flash nonvolatile memory.

A row decoder 2 selecting the word lines of the memory cell array 1 is arranged in a row decoder region ROW DCR. A contact wiring structure electrically connecting the memory cell array 1 to the row decoder 2 may be arranged in the contact region CTR. The row decoder 2 selects one of the memory blocks BLK0 to BLKn of the memory cell array 1 according to address information, and selects one of the word lines of the selected memory block. The row decoder 2 may provide a word line voltage generated from a voltage generating circuit to each of the selected word line and the unselected word lines in response to the control of a control circuit. The row decoder may provide voltages (potentials) to the string select lines SSL, ground select lines GSL, and dummy lines DL, and corresponding transistors connected to these lines, such as those described elsewhere herein.

A page buffer 3 for reading information stored in the memory cells may be arranged in the page buffer region PBR. The page buffer 3 may temporarily store data that is to be stored in the memory cells, or may sense data stored in the memory cells, depending upon operation modes. The page buffer 3 may operate as a write driver circuit in a program operation mode, and may operate as a sense amplifier circuit in a read operation mode. For example, the page buffer 3 may temporarily store data that is to be stored in the memory cells in a program operation mode, and may sense data stored in the memory cells in a read operation mode.

A column decoder 4 that is connected to the bit lines of the memory cell array 1 is arranged in the column decoder region COL DCR. The column decoder 4 may provide a data transfer path between the page buffer 3 and an external device (for example, a memory controller).

Although the cell array region CAR and the peripheral circuit region PERI included in the three-dimensional semiconductor device are shown in FIG. 1 as being arranged in different areas on a plane, the inventive concept is not limited thereto. In some embodiments, the three-dimensional semiconductor device may have a Chip-on-Pen (CoP) structure, in which the cell array region CAR is vertically arranged on the peripheral circuit region PERI.

Figure 3:
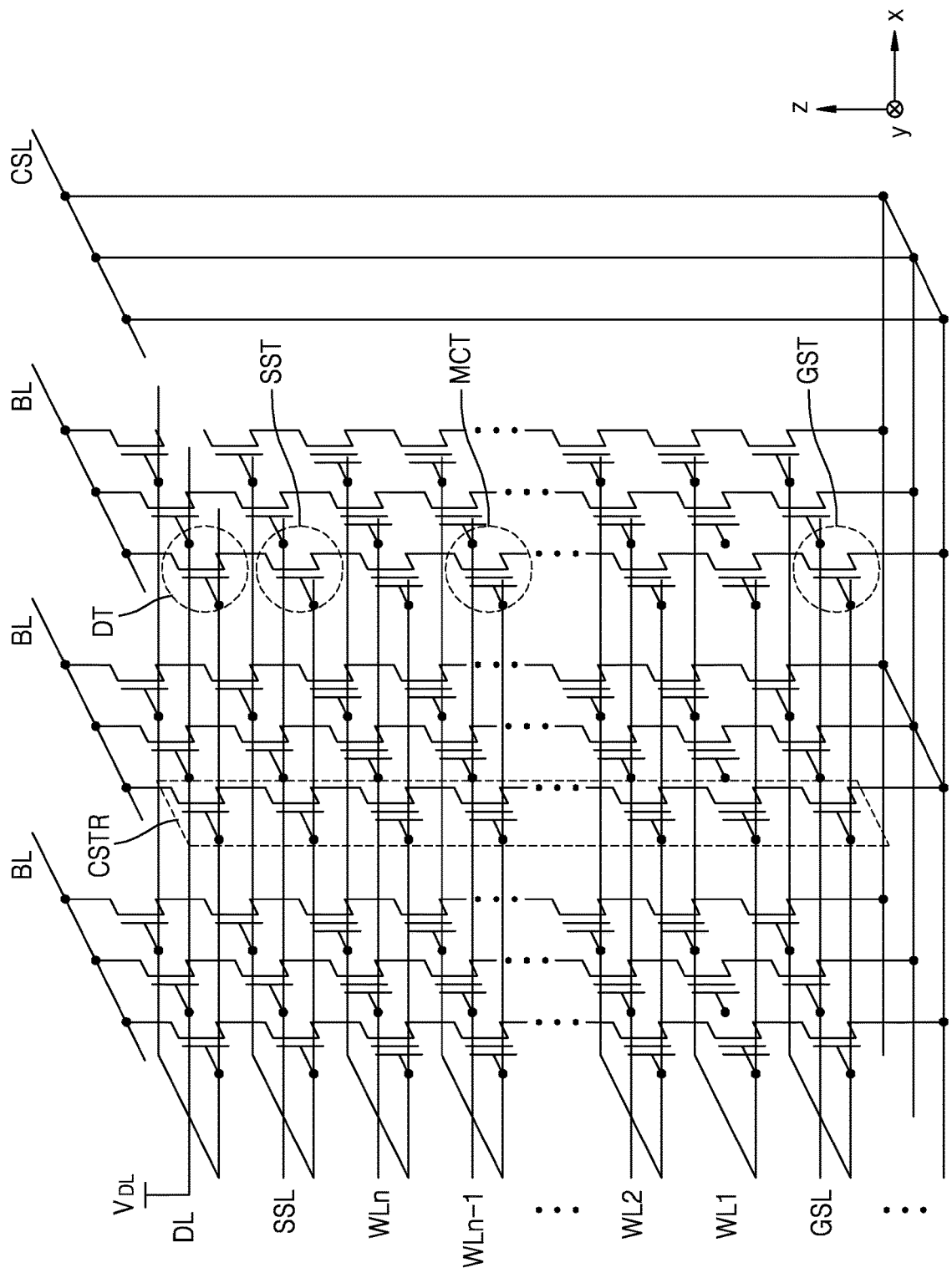
FIG. 3 is a circuit diagram illustrating a three-dimensional memory cell array of a three-dimensional semiconductor device, according to an exemplary embodiment.

FIG. 3 is a circuit diagram illustrating a three-dimensional memory cell array of a three-dimensional semiconductor device, according to an exemplary embodiment.

Referring to FIG. 3, the three-dimensional memory cell array of the three-dimensional semiconductor device may include a common source line CSL, a plurality of bit lines BL, and a plurality of cell strings CSTR arranged between the common source line CSL and the bit lines BL.

The bit lines BL are arranged two-dimensionally, and the plurality of cell strings CSTR are connected to each of the bit lines BL in parallel. The cell strings CSTR may be connected to the common source line CSL in common. For example, the plurality of cell strings CSTR may be arranged between the plurality of bit lines BL and one common source line CSL. In an embodiment, a plurality of common source lines CSL may be two-dimensionally arranged. In some embodiments, an electrically equal voltage may be applied to all of the common source lines CSL. In some other embodiments, each of the common source lines CSL may be independently controlled such that electrically different voltages are applied to the common source lines CSL.

Each of the cell strings CSTR may include at least one ground select transistor GST connected to the common source line CSL, at least one string select transistor SST connected to a bit line BL, and a plurality of memory cell transistors MCT arranged between the at least one ground select transistor GST and the at least one string select transistor SST. In some embodiments, each of the cell strings CSTR may include two or more ground select transistors GST connected in series. In some embodiments, each of the cell strings CSTR may include two or more string select transistors SST connected in series.

Each of the cell strings CSTR may further include a dummy transistor DT arranged between the string select transistor SST and the bit line BL. The at least one ground select transistor GST, the plurality of memory cell transistors MCT, the at least one string select transistor SST, and the dummy transistor DT, which constitute each of the cell strings CSTR, may be connected in series.

The common source line CSL may be connected to sources of the ground select transistors GST in common. In addition, a ground select line GSL, a plurality of word lines WL1 to WLn (where n is a positive integer), and a plurality of string select lines SSL, which are arranged between the common source line CSL and the bit lines BL, may be respectively used as gate electrodes of the ground select transistors GST, the memory cell transistors MCT, and the string select transistors SST, respectively. Each of the memory cell transistors MCT may include a data storage element.

Dummy select lines DL may be arranged between the string select lines SSL and the bit lines BL. The dummy select lines DL may be used as gate electrodes of dummy transistors DT. A dummy voltage $V_{DL}$ may be provided to the dummy select lines DL.

In some embodiments, the dummy transistor DT may not substantially perform a function (for example, a switching function) of a transistor. For example, the dummy voltage $V_{DL}$ of a certain electrical potential energy may be provided continuously to the dummy select lines DL such that the dummy transistor DT may continuously maintain a turn-on state. For example, the dummy voltage $V_{DL}$ of a certain electrical potential energy may have an electrical potential energy equal to that of a pass voltage provided to unselected memory cell transistors MCT.

In some embodiments, the dummy transistor DT may perform a function of the string select transistor SST. For example, the dummy voltage $V_{DL}$ having an electrical potential energy equal to that of a voltage provided to the string select lines SSL may be provided to the dummy select lines DL such that the dummy transistor DT may perform the function of the string select transistor SST. In this case, the dummy transistor DT and the string select transistor SST, together, may perform functions of two or more string select transistors SST connected in series. In some embodiments, the dummy voltage $V_{DL}$ having an electrical potential energy different from that of the voltage provided to the string select lines SSL may be provided to the dummy select lines DL.

For example, a dummy select line DL may be a conductive line formed adjacent to normal lines or electrodes (e.g., normal word lines). A dummy select line DL may be patterned from the same conductive layer(s) forming such normal word lines or electrodes. For example, a dummy select line DL may be formed with the same processes that deposit and pattern the conductive layer(s) forming normal word lines.

As used herein, items described as being "connected" may be physically connected and/or electrically connected such that an electrical signal can be passed from one item to the other. For example, an electrically conductive component (e.g., a wire, pad, internal electrical line, etc.) physically connected to another electrically conductive component (e.g., a wire, pad, internal electrical line, etc.) may also be electrically connected to that component.

Figure 4:
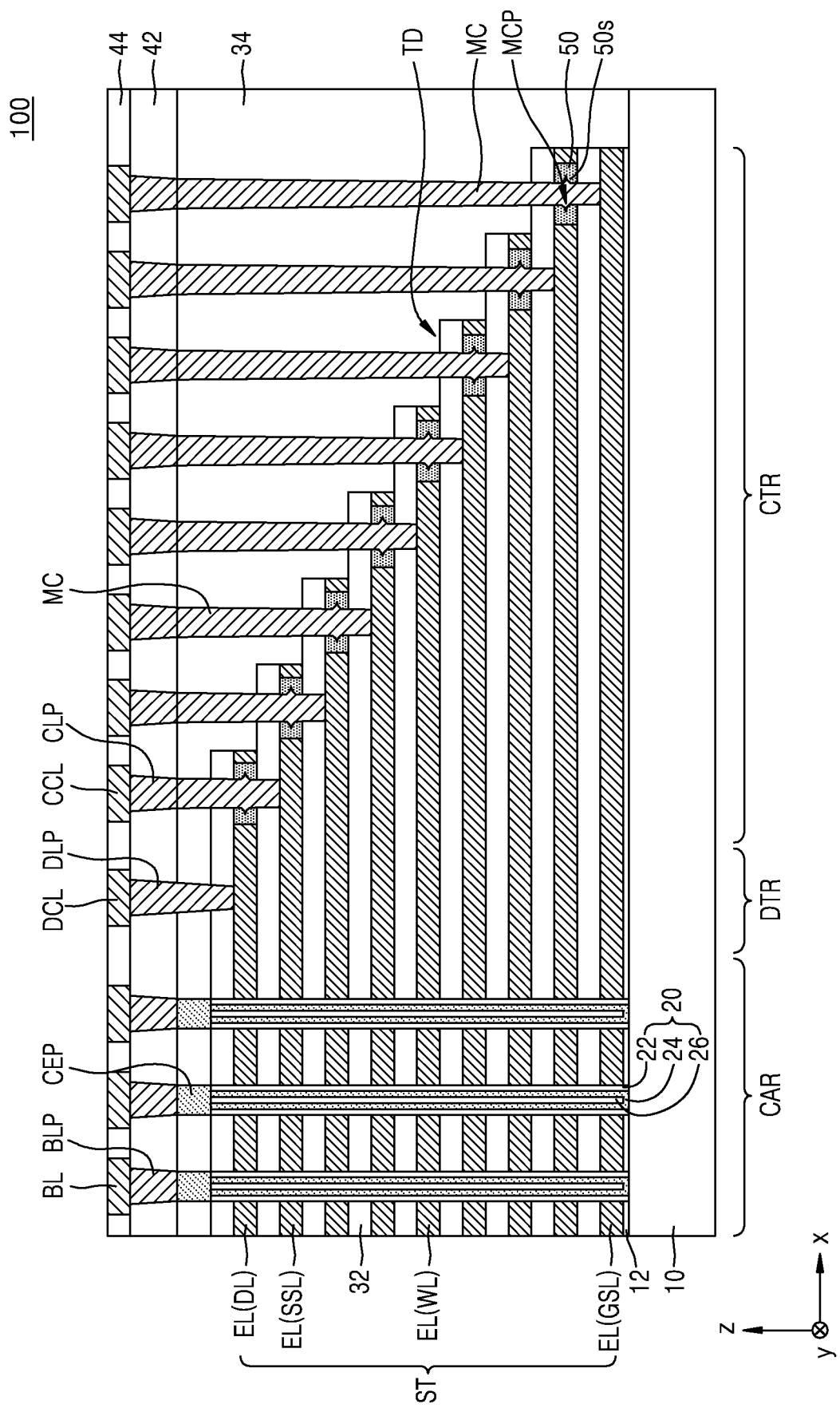
FIG. 4 is a cross-sectional view of a three-dimensional semiconductor device, according to an exemplary embodiment.

FIG. 4 is a cross-sectional view of a three-dimensional semiconductor device according to an exemplary embodiment.

Referring to FIG. 4, a three-dimensional semiconductor device 100 may include the cell array region CAR, the contact region CTR, and a dummy contact region DTR between the cell array region CAR and the contact region CTR, on a substrate 10. In some embodiments, the peripheral circuit region PERI shown in FIG. 1 may be arranged in opposition to the cell array region CAR with reference to the contact region CTR. For example, the contact region CTR may be arranged between the peripheral circuit region PERI and the cell array region CAR on the substrate 10. In some embodiments, the peripheral circuit region PERI shown in FIG. 1 may be arranged under the substrate 10.

The substrate 10 may include a semiconductor material. In some embodiments, the substrate 10 may be a silicon wafer. In some embodiments, the substrate 10 may have a silicon-on-insulator (SOI) structure or a germanium-on-insulator (GeOI) structure. The substrate 10 may include one or more conductive regions, for example, one or more impurity-doped wells.

A stacked structure ST including a plurality of vertically stacked electrodes EL may be arranged on the substrate 10. Vertical structures 20 penetrating the stacked structure ST, each constituting a cell string CSTR of FIG. 3, may be arranged in the cell array region CAR. A plurality of select transistors included in one cell string CSTR may be respectively configured at intersection points between the vertical structures 20 and the electrodes EL. For example, the ground select transistor GST of FIG. 3, the memory cell transistors MCT of FIG. 3, the string select transistor SST of FIG. 3, and the dummy transistor DT of FIG. 3, which are connected in series, may be respectively arranged at intersection points between one vertical structure 20 and the electrodes EL from bottom to top, and thus may constitute one cell string CSTR.

A cell pad CEP may be arranged on the vertical structure 20. The cell pad CEP may include, for example, impurity-doped polysilicon or a metal material.

In some embodiments, the stacked structure ST may have a line-shaped structure extending in a first direction (x-direction). In some embodiments, the stacked structure ST may have a flat plate-shaped structure covering the cell array region CAR. The stacked structure ST may have a stepwise structure in the contact region CTR. For example, a length in the x-direction of individual ones of the vertically stacked electrodes EL may incrementally decrease from the bottommost one of the stacked electrodes EL to the topmost one of the stacked electrodes EL, such that the length of each electrode EL progressively decreases the closer the electrode EL is to the top of the stacked structure ST. The vertical height of the stacked structure ST in the contact region CTR may gradually increase with decreasing distance from the cell array region CAR. For example, the stacked structure ST may have a sloped profile in the contact region CTR.

A lower gate dielectric film 12 may be arranged between the substrate 10 and the stacked structure ST. For example, the lower gate dielectric film 12 may include silicon oxide, silicon nitride, silicon oxynitride, gallium oxide, germanium oxide, a high-K dielectric, or combinations thereof. The lower gate dielectric film 12 may include, for example, silicon oxide formed by a thermal oxidation process.

The stacked structure ST may include a plurality of electrodes EL and a plurality of electrode isolation insulating layers 32, which are alternately stacked on the substrate 10 in a vertical direction (z-direction). The vertical direction (z-direction) may be perpendicular to the first direction (x-direction). The electrode isolation insulating layers 32 may fill spaces between vertically adjacent electrodes EL and respectively cover each of the plurality of electrodes EL. The electrodes EL may include doped-silicon, a metal (for example, tungsten), a metal nitride, a metal silicide, or combinations thereof.

The electrode isolation insulating layers 32 each may have thicknesses equal to one other, or some of the electrode isolation insulating layers 32 may have thicknesses that are different from one or more of the others. The proximity of adjacent ones of the plurality of electrodes EL may vary based on thicknesses of electrode isolation insulating layers 32 between electrodes EL. For example, the separation distance between adjacent electrodes EL may be relatively smaller when the thickness of the electrode isolation insulating layer 32 formed therebetween is relatively thinner, and the separation distance between adjacent electrodes EL may be relatively larger when the thickness of the electrode isolation insulating layer 32 formed therebetween is relatively thicker. Ends of some of the electrodes EL may have a stepwise structure on the contact region CTR. Some of the electrodes EL may have decreasing areas with increasing distance from a top surface of the substrate 10. For example, as the lengths in the x-direction of individual ones of the vertically stacked electrodes EL progressively decrease from the bottommost one of the stacked electrodes EL to the topmost one of the stacked electrodes EL, the area of top surface of the electrode EL, defined by the length of the electrode EL in the first direction (x-direction) and the width in the second direction (y-direction), may decrease. Sidewalls of some of the electrodes EL may be arranged at horizontally different positions from each other in the contact region CTR. For example, the horizontal positions of the sidewalls formed in the vertical direction (z-direction) at the ends of each electrodes EL in the contact region CTR may change in correspondence to the change in length of the electrode EL in the first direction (x-direction).

Specifically, ends of remaining electrodes EL except a lowermost electrode EL among the electrodes EL may have a stepwise structure on the contact region CTR. The remaining electrodes EL except the lowermost electrode EL among the electrodes EL may have decreasing areas with increasing distance from the top surface of the substrate 10. Sidewalls of the remaining electrodes EL except the lowermost electrode EL among the electrodes EL may be arranged at horizontally different positions from each other in the contact region CTR.

Two electrodes EL stacked at lowermost positions among the electrodes EL may have an equal area. Sidewalls of the two lowermost electrodes EL among the electrodes EL may be arranged at a horizontally equal position in the contact region CTR. For example, ends of the two lowermost electrodes EL among the electrodes EL may be vertically aligned (in the z-direction) with each other at an equal position (in the x-direction) in the contact region CTR.

The vertical structures 20 may penetrate the stacked structure ST and be connected to the substrate 10. The vertical structures 20 may include semiconductor materials or conductive materials. The vertical structures 20 may each include a vertical column 24 connected to the substrate 10, and a data storage element 22 located between the vertical column 24 and an electrode EL. The data storage element 22 may have a cylinder or pipe shape, and may extend continuously from a top surface of the first insulating layer 34 to a top surface of the substrate 10.

The vertical column 24 may include silicon or silicon germanium doped with impurity ions of a first conductivity type (for example, a p-type). The vertical column 24 may have a hollow cylinder shape (for example, a macaroni shape) and thus include an inner hole. The vertical column 24 may be formed on an interior sidewall of the data storage element 22, and may extend continuously from the top surface of the first insulating layer 34 to a top surface of the substrate 10. The vertical structures 20 may each include a filling insulating layer 26 filling the inner hole included in the vertical column 24. The filling insulating layer 26 may extend continuously from the top surface of the first insulating layer 34 to a top surface of the vertical column 24 formed on the substrate 10. The filling insulating layer 26 may include an insulating material having excellent gap-fill properties. For example, the filling insulating layer 26 may include silicon oxide such as a high-density plasma oxide film, a spin-on-glass (SOG) layer, or a CVD oxide film.

In some embodiments, the vertical structures 20 may be arranged along a second direction (y-direction). In some embodiments, the vertical structures 20 may be arranged in a zigzag manner in the second direction (y-direction). The second direction (y-direction) may be perpendicular to the first direction (x-direction) and the third direction (z-direction).

In some embodiments, a semiconductor pattern (not shown) formed by performing a selective epitaxial growth (SEG) process using the top surface of the substrate 10 as a seed may be arranged between each vertical structure 20 and the substrate 10. In some embodiments, a top surface of the semiconductor pattern may be at a higher level than a top surface of the lowermost electrode EL among the electrodes EL.

A first insulating layer 34, which covers the stacked structure ST in the cell array region CAR, dummy contact region DTR, and the contact region CTR, may be arranged on a whole surface of the substrate 10. The first insulating layer 34 may have a planarized top surface. The first insulating layer 34 may cover ends of layers of the stacked structure ST. For example, the first insulating layer 34 may cover the sidewalls formed in the vertical direction (z-direction) at the ends of each electrodes EL in the contact region CTR. The first insulating layer 34 may include, for example, a silicon oxide layer, a low-K dielectric layer having a lower dielectric constant than a silicon oxide layer, or combinations thereof.

A contact plug MC, which is electrically connected to a portion of each of the electrodes EL, may be arranged in the contact region CTR. The contact plug MC may include a metal, a conductive metal nitride, a transition metal, or combinations thereof. In some embodiments, the contact plug MC may include a conductive barrier layer and a filling layer. The conductive barrier layer may include, for example, Ti, TiN, or TaN. The filling layer may include, for example, W.

Contact plugs MC may be respectively electrically connected to electrodes SSL, WL, and GSL except an uppermost electrode EL among the electrodes EL (e.g., a dummy select line DL), that is, connected to a string select line SSL, word lines WL, and a ground select line GSL. In the contact region CTR, the contact plugs MC may penetrate the first insulating layer 34 and be respectively connected to portions adjacent to ends of the electrodes SSL, WL, and GSL among the electrodes EL, except the dummy select line DL.

The contact plugs MC connected to different electrodes EL among the electrodes EL may have different vertical lengths in the z-direction (i.e., heights) from each other. The vertical length of the contact plug MC connected to the electrode EL at a relatively lower position among the electrodes EL may be greater than the vertical length of the contact plug MC connected to the electrode EL at a relatively upper position. In some embodiments, the vertical lengths in the z-direction (i.e., heights) of the contact plugs MC may decrease with decreasing distance from the cell array region CAR. The vertical lengths in the z-direction of the contact plugs MC may correspond to the lengths in the x-direction of individual ones of the vertically stacked electrodes EL. For example, a longest one of the contact plugs MC may be electrically connected to a longest one of the electrodes EL at the furthest distance from the cell array region CAR, and a shortest one of the contact plugs MC may be electrically connected to a shortest one of the electrodes EL (excepting the dummy select line DL) at the closest distance to the cell array region CAR. In some embodiments, contact plugs MC may have a substantially cylindrical shape, and may have substantially vertical sidewalls continuously extending from a top surface of the first insulating layer 34 to a top surface of the electrode EL to which it is electrically connected. Top surfaces of the contact plugs MC may be substantially on a same plane. For example, the top surface of each contact plug MC may be at the same vertical layer and may be substantially coplanar with each other and a top surface of the first insulating layer 34. In some embodiments, the contact plugs MC may each have a tapered shape having a decreasing horizontal cross-sectional area from top (further from the substrate 10 in the z-direction) to bottom (closer to the substrate 10 in the z-direction). In embodiments in which contact plugs MC have a tapered shape, the contact plugs MC may have sidewalls that extend continuously from top to bottom without substantially horizontal sidewall segments.

Each contact plug MC connected to one of the electrodes EL may penetrate another electrode EL above (in the vertical direction) the one electrode EL to which the contact plug MC is connected. Specifically, each contact plug MC may penetrate an uppermost electrode EL in a region of each of tread portions TD of the stepwise structure of the stacked structure ST and be connected to another electrode EL under the uppermost electrode EL. For example, the contact plug MC connected to a corresponding one of the electrodes EL may penetrate the electrode EL that is adjacent to and above (in the z-direction) the one electrode EL to which the contact plug MC is connected. As used herein, a tread portion TD may refer to the portion of an electrode EL that is not covered by any other electrodes EL that may overlie with respect to the electrodes EL of stack ST (including the string select line SSL and ground select line GSL) (although other stacks formed above stack ST may have electrodes over tread portions TD of electrodes EL of stack ST). For example, an uppermost electrode EL of a set of electrodes used to form the stack ST may not have any other electrodes EL formed above it, and thus the full electrode EL of this uppermost electrode EL may be a tread portion TD. For other electrodes EL, the tread portion TD may be that portion extending beyond electrodes EL formed above it. In the region of each of the tread portions TD having top surfaces at different levels from each other in the stepwise structure of the stacked structure ST, the uppermost electrode EL may be an electrode EL at a different level from the others among the electrodes EL. An insulating barrier layer 50, which partially surrounds a side surface of each contact plug MC, may be arranged between each contact plug MC and the electrode EL penetrated thereby. Thus, each contact plug MC may be electrically insulated from the electrode EL through which it penetrates, and electrically connected to another electrode EL under the penetrated electrode EL. Inner and outer side surfaces of the insulating barrier layer 50 may respectively contact the contact plug MC and the electrode EL penetrated by the contact plug MC. Top and bottom surfaces of the insulating barrier layer 50 may respectively contact the electrode isolation insulating layers 32 covering top and bottom surfaces of the electrode EL penetrated by the contact plug MC.

In some embodiments, each contact plug MC may have a plug protrusion MCP extending into the insulating barrier layer 50. The plug protrusion MCP may have a shape protruding toward the electrode EL penetrated by the contact plug MC. For example, the plug protrusion MCP may protrude in an x-direction. In the area of the plug protrusion MCP, the contact plug MC may have a width in the x-direction that is wider than the width of the contact plug MC where it is electrically connected to the electrode EL below the penetrated electrode EL. The insulating barrier layer 50 may have a slit 50s corresponding to the plug protrusion MCP.

A second insulating layer 42 covering the first insulating layer 34, and a plurality of landing plugs BLP, DLP, and CLP penetrating the second insulating layer 42 may be arranged on the first insulating layer 34. The plurality of landing plugs BLP, DLP, and CLP may include a bit line landing plug BLP, a dummy landing plug DLP, and a contact landing plug CLP. Each of the bit line landing plug BLP, the dummy landing plug DLP, and the contact landing plug CLP may include a same material. Each of the plurality of landing plugs BLP, DLP, and CLP may include doped silicon, a metal, a metal nitride, a metal silicide, or combinations thereof. In some embodiments, each of the plurality of landing plugs BLP, DLP, and CLP may include a different material from the contact plug MC.

The bit line landing plug BLP, which is connected to the cell pad CEP, may be arranged in the cell array region CAR. The dummy landing plug DLP may be arranged in the dummy contact region DTR, and may penetrate both the second insulating layer 42 and the first insulating layer 34 and be connected to the uppermost electrode EL of the stacked structure ST (i.e., the dummy select line DL). In some embodiments, in the case that the electrode isolation insulating layer 32 covers the dummy select line DL located at an uppermost end of the stacked structure ST, the dummy landing plug DLP may penetrate all of the second insulating layer 42, the first insulating layer 34, and the electrode isolation insulating layer 32. The contact landing plug CLP, which penetrates the second insulating layer 42 and is connected to the contact plug MC, may be arranged in the contact region CTR. Each of the bit line landing plug BLP, the dummy landing plug DLP, and the contact landing plug CLP may be comprise the same metal extending from the top of the contact landing plug CLP to the bottom of the contact landing plug CLP. The contact landing plugs CLP may be formed with the same layer or same layers of conductive metal.

Top surfaces of the bit line landing plug BLP, the dummy landing plug DLP, and the contact landing plug CLP may be substantially on a same plane. For example, the top surfaces of each of the landing plugs BLP, DLP, and CLP may be at the same vertical layer and may be substantially coplanar with one another and the top surface of the second insulating layer 42, and bottom surfaces of each of the landing plugs BLP, DLP, and CLP may be substantially coplanar with one another and the bottom surface of the second insulating layer 42. As used herein, items described as "substantially planar" or "substantially coplanar" may be exactly the same, equal, or planar, or may be the same, equal, or planar within acceptable variations that may occur, for example, due to manufacturing processes.

In some embodiments, the vertical length in the z-direction (i.e., the height) of the dummy landing plug DLP may be greater than the vertical lengths in the z-direction (i.e., heights) of the bit line landing plug BLP and the contact landing plug CLP. For example, the dummy landing plug DLP may extend further toward the substrate 10 than each of the bit line landing plug BLP and the contact landing plug CLP.

Connection lines BL, DCL, and CCL and a wiring insulating layer 44 filling spaces therebetween may be arranged on the second insulating layer 42 and the landing plugs BLP, DLP, and CLP. The wiring insulating layer 44 may include, for example, silicon oxide.

The connection lines BL, DCL, and CCL may include the bit line BL, a dummy connection line DCL, and a contact connection line CCL. Top surfaces of the bit line BL, the dummy connection line DCL, and the contact connection line CCL may be at the same vertical level. For example, the top surfaces of each of the landing plugs BL, DCL, and CCL may be substantially coplanar with one another and the top surface of the wiring insulating layer 44, and bottom surfaces of each of the landing plugs BL, DCP, and CCP may be substantially coplanar with one another and the bottom surface of the wiring insulating layer 44. The bit line BL may be located above a corresponding bit line landing plug BLP, and the bit line BL may have a width in the x-direction that is greater than a width of its corresponding bit line landing plug BLP. The dummy connection line DCL may be located above a corresponding dummy landing plug DLP, and the dummy connection line DCL may have a width in the x-direction that is greater than a width of its corresponding dummy landing plug DLP. The contact connection line CCL may be located above a corresponding contact landing plug CLP, and the contact connection line CCL may have a width in the x-direction that is greater than a width of its corresponding contact landing plug CLP.

The bit line BL may be electrically connected to the vertical column 24 via the bit line landing plug BLP and the cell pad CEP. The dummy connection line DCL may be electrically connected to the dummy select line DL via the dummy landing plug DLP. The contact connection line CCL may be electrically connected to the contact plug MC via the contact landing plug CLP.

In some embodiments, a voltage of a certain electrical potential energy may always be provided to the dummy connection line DCL, the dummy landing plug DLP, and the dummy select line DL such that the dummy transistor DT of FIG. 3 may always maintain a turn-on state. For example, the voltage of a certain electrical potential energy may have a electrical potential energy equal to that of the pass voltage provided to the unselected memory cell transistors MCT of FIG. 3, whereby the dummy transistor DT may not substantially perform a function (for example, a switching function) of a transistor.

In some embodiments, an electrical potential energy that allows the dummy transistor DT of FIG. 3 to perform a function of the string select transistor SST may be provided to the dummy connection line DCL, the dummy landing plug DLP, and the dummy select line DL. For example, a voltage of a same electrical potential energy may be provided to two uppermost electrodes EL, that is, the dummy select line DL and the string select line SSL, among the electrodes EL. In this case, the string select transistor SST and the dummy transistor DT may respectively operate as a first string select transistor and a second string select transistor, whereby the three-dimensional semiconductor device 100 may have a structure in which one cell string CSTR of FIG. 3 has two string select transistors.

In the three-dimensional semiconductor device 100 according to an embodiment, since the contact plug MC penetrates one electrode EL and is connected to another electrode EL under the penetrated electrode EL, even though the height of the contact plug MC is increased due to an increase in the height of the stacked structure ST caused by an increase in the number of the stacked electrodes EL included in the stacked structure ST, the contact plug MC is supported by the electrode EL penetrated by the contact plug MC and/or the insulating barrier layer 50, whereby structural stability of the contact plug MC may be provided.

As described below, since the electrode EL penetrated by each contact plug MC functions as an etch stop layer during the process of forming contact holes having different depths to form the contact plugs MC having different heights, each contact plug MC may be prevented from penetrating the electrode EL connected thereto to cause damage to the electrode isolation insulating layer 32 under the electrode EL or to be connected to another electrode EL under the electrode EL, thereby securing electrical reliability.

Figure 5:
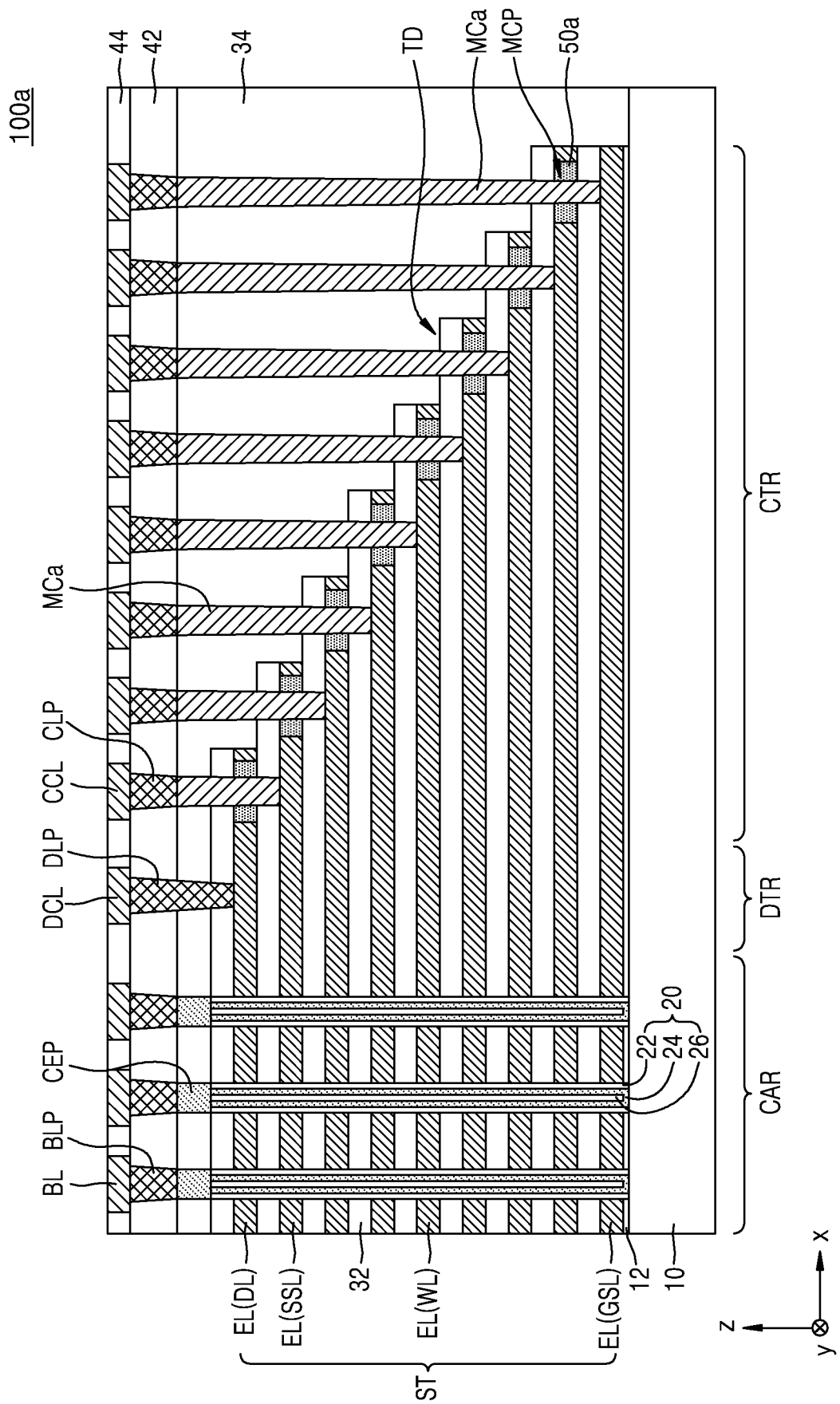
FIG. 5 is a cross-sectional view of a three-dimensional semiconductor device, according to an exemplary embodiment.

FIG. 5 is a cross-sectional view of a three-dimensional semiconductor device according to an example embodiment. In descriptions with reference to FIG. 5, descriptions overlapping with the descriptions with reference to FIG. 4 may be omitted, and like components will be denoted by like reference numerals unless otherwise stated.

Referring to FIG. 5, a three-dimensional semiconductor device 100a may include the cell array region CAR, the contact region CTR, and the dummy contact region DTR between the cell array region CAR and the contact region CTR, on the substrate 10.

The three-dimensional semiconductor device 100a includes contact plugs MCa arranged in the contact region CTR and respectively electrically connected to portions of the electrodes EL. The contact plugs MCa may be respectively electrically connected to the electrodes SSL, WL, and GSL, except the uppermost electrode EL among the electrodes EL (e.g., the dummy select line DL).

Each contact plug MCa connected to one of the electrodes EL may penetrate another electrode EL above (in the vertical direction) the one electrode EL to which it is connected. Specifically, each contact plug MCa may penetrate the uppermost electrode EL in the region of each of the tread portions TD of the stepwise structure of the stacked structure ST and be electrically connected to another electrode EL under the penetrated uppermost electrode EL.

An insulating barrier layer 50a, which partially surrounds a side surface of each contact plug MCa, may be arranged between each contact plug MCa and the electrode EL penetrated thereby. Thus, each contact plug MCa may be electrically insulated from the electrode EL penetrated thereby, and be electrically connected to another electrode EL under the penetrated electrode EL.

Each of the contact plugs MCa included in the three-dimensional semiconductor device 100a shown in FIG. 5 may not have the plug protrusion MCP of each of the contact plugs MC included in the three-dimensional semiconductor device 100 shown in FIG. 4. Likewise, the insulating barrier layer 50a included in the three-dimensional semiconductor device 100a shown in FIG. 5 may not have the slit 50s of the insulating barrier layer 50 included in the three-dimensional semiconductor device 100 shown in FIG. 4. In the embodiment of FIG. 5, each of the contact plugs MCa may have substantially vertical sidewalls continuously extending from the top surface of the first insulating layer 34 to the electrode EL to which the contact plugs MCa is connected.

Figure 6:
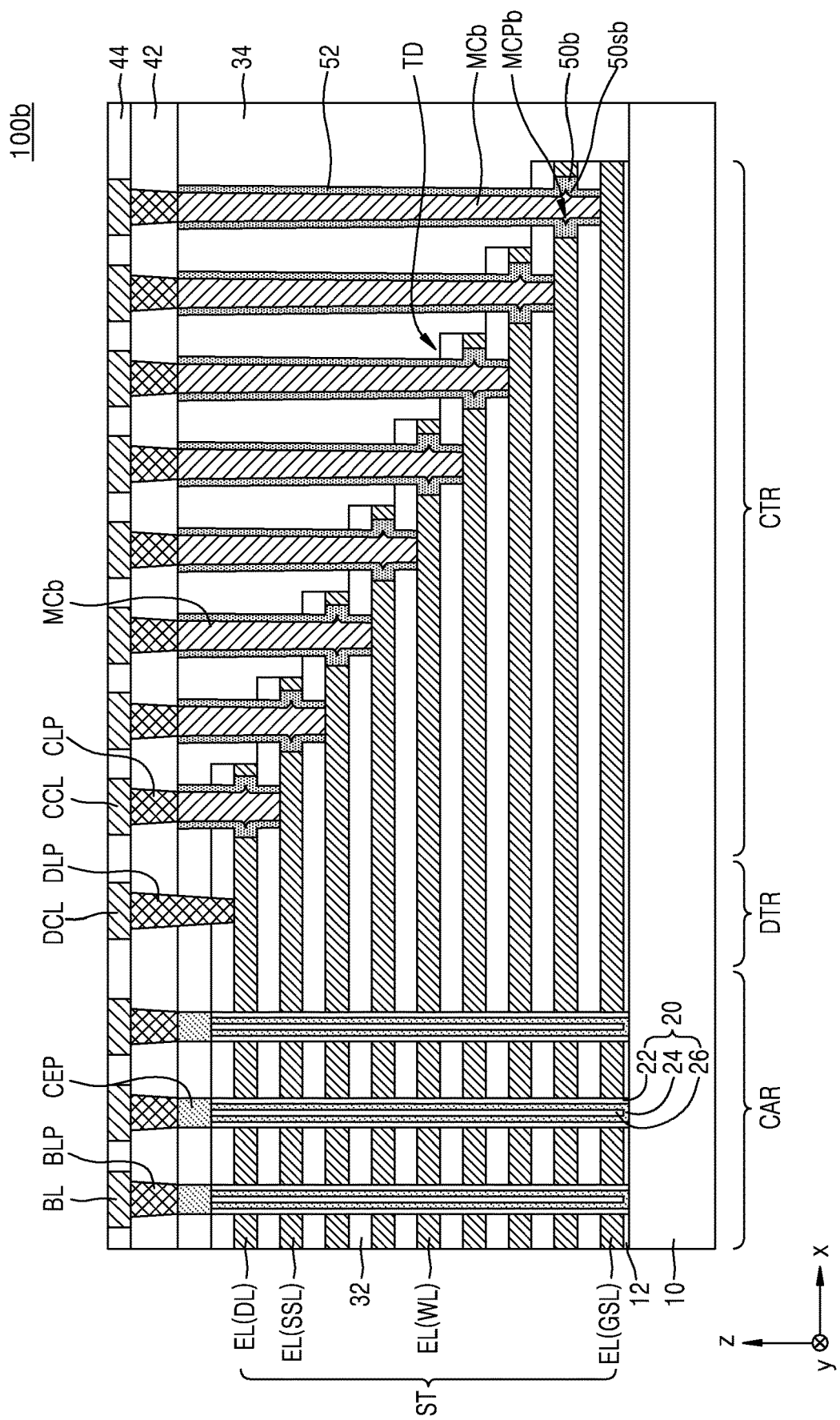
FIG. 6 is a cross-sectional view of a three-dimensional semiconductor device, according to an exemplary embodiment.

FIG. 6 is a cross-sectional view of a three-dimensional semiconductor device according to an exemplary embodiment. In descriptions with reference to FIG. 6, descriptions overlapping with the descriptions with reference to FIGS. 4 and 5 may be omitted, and like components will be denoted by like reference numerals unless otherwise stated.

Referring to FIG. 6, a three-dimensional semiconductor device 100b may include the cell array region CAR, the contact region CTR, and the dummy contact region DTR between the cell array region CAR and the contact region CTR, on the substrate 10.

The three-dimensional semiconductor device 100b includes contact plugs MCb arranged in the contact region CTR and respectively electrically connected to portions of the electrodes EL. The contact plugs MCb may be respectively electrically connected to the electrodes SSL, WL, and GSL, except the uppermost electrode EL among the electrodes EL (e.g., the dummy select line DL).

Each contact plug MCb connected to one of the electrodes EL may penetrate another electrode EL over the one electrode EL to which it is connected. Specifically, each contact plug MCb may penetrate the uppermost electrode EL in the region of each of the tread portions TD of the stepwise structure of the stacked structure ST and be electrically connected to another electrode EL under the penetrated uppermost electrode EL.

An insulating barrier layer 50b, which partially surrounds a side surface of each contact plug MCb, may be arranged between each contact plug MCb and the electrode EL penetrated thereby. Each contact plug MCb may have a plug protrusion MCPb extending into the insulating barrier layer 50b. The plug protrusion MCPb may have a shape protruding toward the electrode EL penetrated by each contact plug MCb. For example, the plug protrusion MCPb may protrude in an x-direction. In the area of the plug protrusion MCPb, the contact plug MCb may have a width in the x-direction that is wider than the width of the contact plug MCb where it is electrically connected to the electrode EL below the penetrated electrode EL. The insulating barrier layer 50b may have a slit 50sb corresponding to the plug protrusion MCPb.

In addition, a contact spacer 52 surrounding the side surface of each contact plug MCb may be further arranged between each contact plug MCb and both of the first insulating layer 34 and the electrode isolation insulating layer 32 penetrated by each contact plug MCb. A top surface of each contact plug MCb and an uppermost end of the contact spacer 52 may be on a same plane. For example, the top surface of each contact plug MCb and the uppermost end of each contact spacer 52 may be at the same vertical layer and may be substantially coplanar with a top surface of the first insulating layer 34.

Thus, each contact plug MCb may be electrically insulated from the electrode EL penetrated thereby, and electrically connected to another electrode EL under the penetrated electrode EL.

In some embodiments, the insulating barrier layer 50b and the contact spacer 52 may include a same material. In some embodiments, the insulating barrier layer 50b and the contact spacer 52, which surround one contact plug MCb, may be integrated into one body. For example, the insulating barrier layer 50b and the contact spacer 52 may be formed in a single process.

Figure 7:
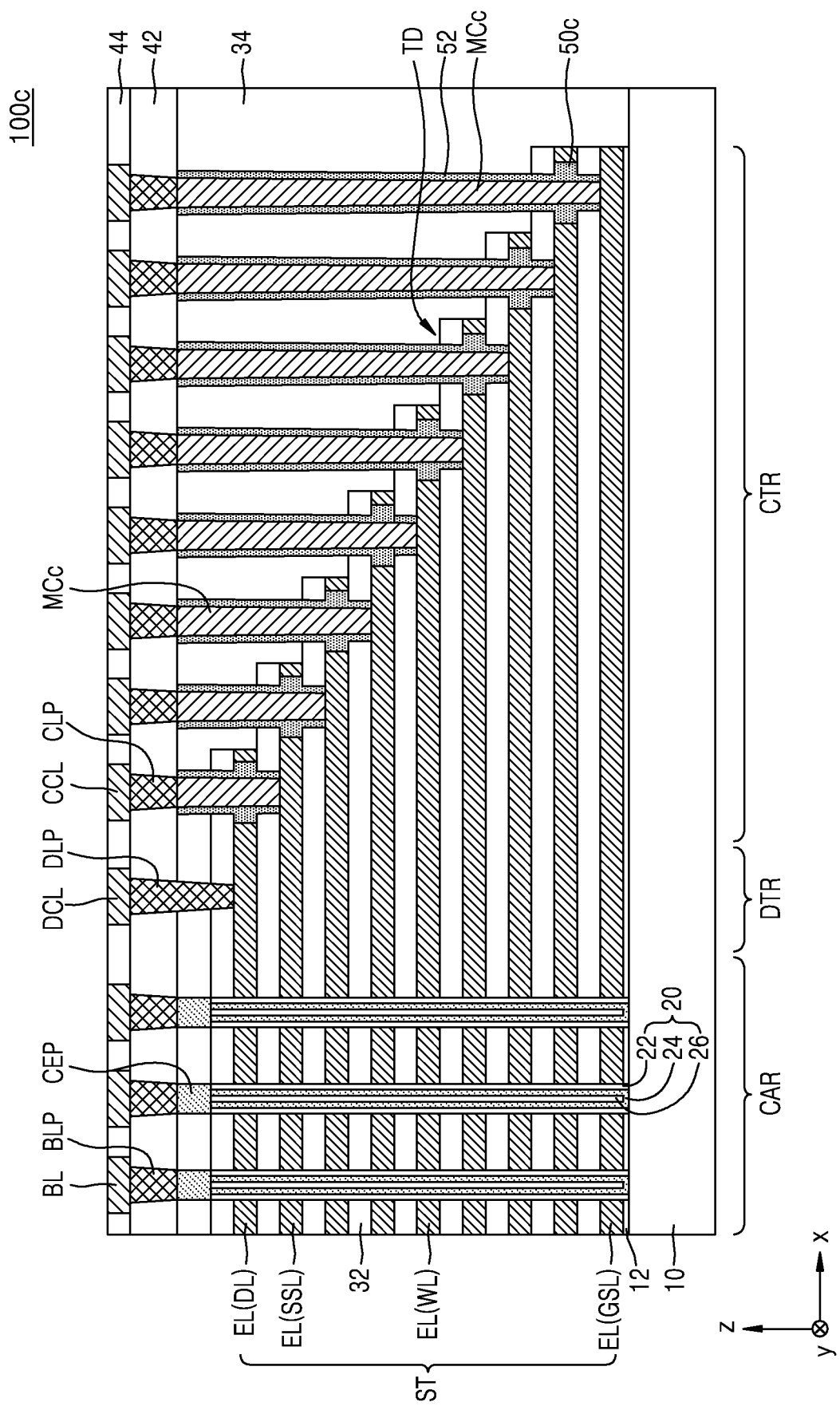
FIG. 7 is a cross-sectional view of a three-dimensional semiconductor device, according to an exemplary embodiment.

FIG. 7 is a cross-sectional view of a three-dimensional semiconductor device according to an exemplary embodiment. In descriptions with reference to FIG. 7, descriptions overlapping with the descriptions with reference to FIGS. 4 to 6 may be omitted, and like components will be denoted by like reference numerals unless otherwise stated.

Referring to FIG. 7, a three-dimensional semiconductor device 100c may include the cell array region CAR, the contact region CTR, and the dummy contact region DTR between the cell array region CAR and the contact region CTR, on the substrate 10.

The three-dimensional semiconductor device 100c includes contact plugs MCc arranged in the contact region CTR and respectively electrically connected to portions of the electrodes EL. The contact plugs MCc may be respectively electrically connected to the electrodes SSL, WL, and GSL, except the uppermost electrode EL among the electrodes EL (e.g., the dummy select line DL).

Each contact plug MCc connected to one of the electrodes EL may penetrate another electrode EL above (in the vertical direction) the one electrode EL to which it is connected. Specifically, each contact plug MCc may penetrate the upper or uppermost electrode EL in the region of each of the tread portions TD of the stepwise structure of the stacked structure ST and be connected to another electrode EL under the penetrated uppermost electrode EL.

An insulating barrier layer 50c, which partially surrounds a side surface of each contact plug MCc, may be arranged between each contact plug MCc and the electrode EL penetrated thereby.

In addition, the contact spacer 52 surrounding the side surface of each contact plug MCc may be further arranged between each contact plug MCc and both of the first insulating layer 34 and the electrode isolation insulating layer 32 penetrated by each contact plug MCc.

Thus, each contact plug MCc may be electrically insulated from the electrode EL penetrated thereby, and electrically connected to another electrode EL under the penetrated electrode EL.

In some embodiments, the insulating barrier layer 50c and the contact spacer 52 may include a same material. In some embodiments, the insulating barrier layer 50c and the contact spacer 52, which surround one contact plug MCc, may be integrated into one body. For example, the insulating barrier layer 50b and the contact spacer 52 may be formed in a single process.

Figure 8:
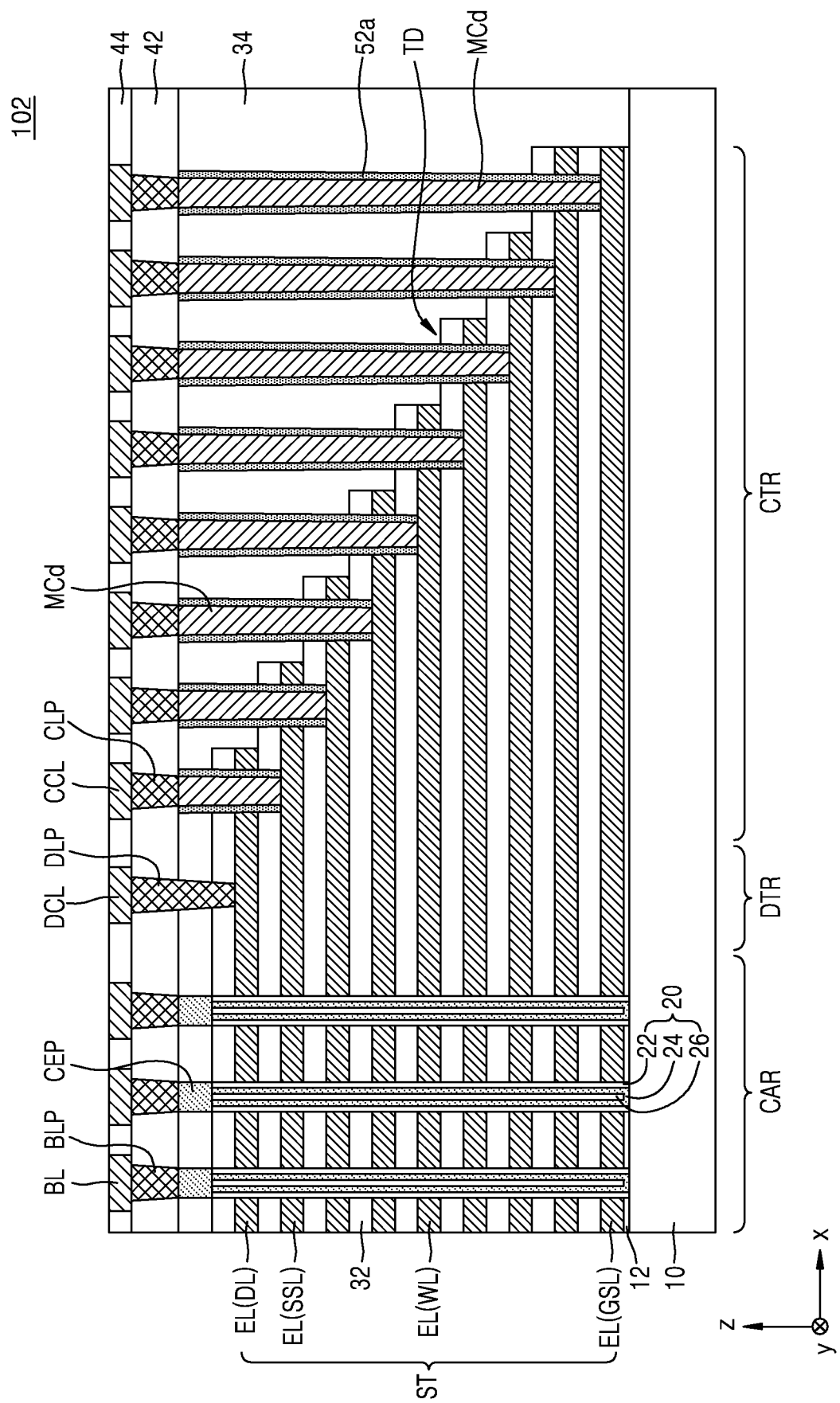
FIG. 8 is a cross-sectional view of a three-dimensional semiconductor device, according to an exemplary embodiment.

FIG. 8 is a cross-sectional view of a three-dimensional semiconductor device according to an embodiment. In descriptions with reference to FIG. 8, descriptions overlapping with the descriptions with reference to FIGS. 4 to 7 may be omitted, and like components will be denoted by like reference numerals unless otherwise stated.

Referring to FIG. 8, a three-dimensional semiconductor device 102 may include the cell array region CAR, the contact region CTR, and the dummy contact region DTR between the cell array region CAR and the contact region CTR, on the substrate 10.

The three-dimensional semiconductor device 102 includes contact plugs MCd arranged in the contact region CTR and respectively electrically connected to portions of the electrodes EL. The contact plugs MCd may be respectively electrically connected to the electrodes SSL, WL, and GSL, except the uppermost electrode EL among the electrodes EL (e.g., the dummy select line DL).

Each contact plug MCd connected to one of the electrodes EL may penetrate another electrode EL above (in a z-direction) the one electrode EL to which it is connected. Specifically, each contact plug MCd may penetrate the uppermost electrode EL in the region of each of the tread portions TD of the stepwise structure of the stacked structure ST and be connected to another electrode EL under the penetrated uppermost electrode EL.

A contact spacer 52a surrounding a side surface of each contact plug MCd may be further arranged between each contact plug MCd and all of the first insulating layer 34, the electrode EL, and the electrode isolation insulating layer 32, which are penetrated by each contact plug MCd. Thus, each contact plug MCd may be electrically insulated from the electrode EL penetrated thereby, and electrically connected to another electrode EL under the penetrated electrode EL.

The three-dimensional semiconductor device 102 shown in FIG. 8 may not include the insulating barrier layers 50, 50a, 50b, and 50c respectively included in the three-dimensional semiconductor devices 100, 100a, 100b, and 100c.

FIGS. 9 to 17 are cross-sectional views illustrating a method of fabricating a three-dimensional semiconductor device, according to an exemplary embodiment. Specifically, FIGS. 9 to 17 are cross-sectional views illustrating a method of fabricating the three-dimensional semiconductor device 100 according to an embodiment, shown in FIG. 4. In descriptions with reference to FIGS. 9 to 17, descriptions overlapping with the descriptions with reference to FIG. 4 may be omitted, and like components will be denoted by like reference numerals unless otherwise stated.

Figure 9:
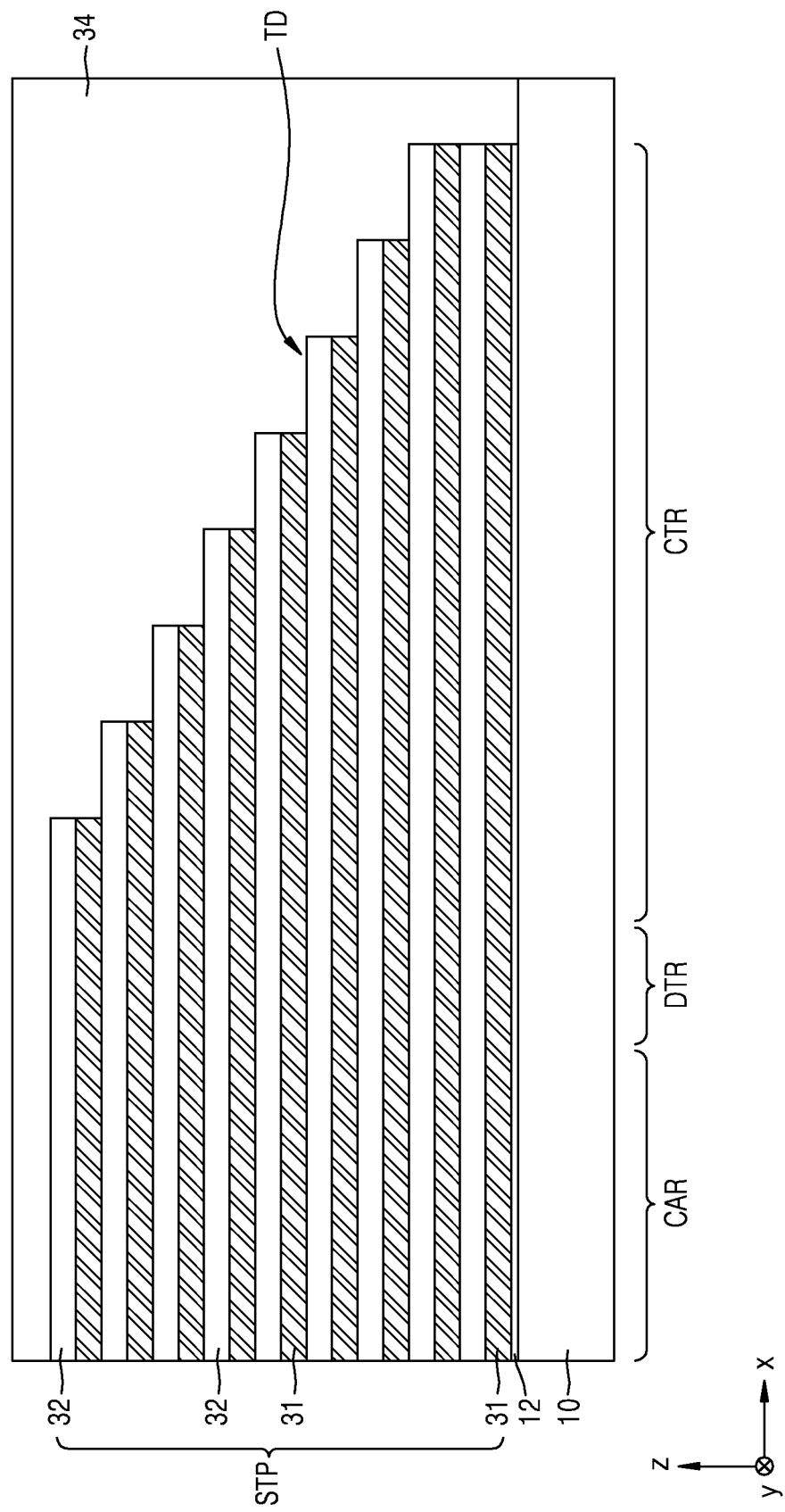
FIGS. 9 to 17 are cross-sectional views illustrating a method of fabricating a three-dimensional semiconductor device, according to an exemplary embodiment.

Referring to FIG. 9, the lower gate dielectric film 12 is formed on the substrate 10, a preliminary stacked structure STP is formed on the lower gate dielectric film 12, and the first insulating layer 34 covering the preliminary stacked structure STP is formed.

The preliminary stacked structure STP may include sacrificial layers 31 vertically stacked over the substrate 10, and the electrode isolation insulating layers 32 respectively covering the sacrificial layers 31 and filling spaces between vertically adjacent sacrificial layers 31.

The preliminary stacked structure STP may be formed by alternately stacking a plurality of preliminary sacrificial layers and a plurality of preliminary isolation insulating layers, followed by partially removing ends of the preliminary sacrificial layers and the preliminary isolation insulating layers. The sacrificial layers 31 and the electrode isolation insulating layers 32 may have a stepwise structure on the contact region CTR. In the preliminary stacked structure STP, the two lowermost sacrificial layers 31 may have sidewalls located at a same horizontal position in the contact region CTR. For example, the two lowermost sacrificial layers 31 among the sacrificial layers 31 may have sidewalls that are vertically aligned with each other at the same location in the x-direction. Other sacrificial layer 31 and other electrode isolation insulating layer 32 among the sacrificial layers 31 and the electrode isolation insulating layers 32 may be located on an upper end of each of the tread portions TD of the stepwise structure. The sidewalls of the two lowermost sacrificial layers 31 may be located at the furthest distance from the cell array region CAR in the x-direction relative to the other sacrificial layers 31, and the other sacrificial layers 31 may have sidewalls in the contact region CTR that are incrementally closer to the cell array region CAR in the x-direction.

After the preliminary stacked structure STP is formed, the first insulating layer 34 covering the preliminary stacked structure STP is formed. The first insulating layer 34 may have a planarized top surface. The first insulating layer 34 may cover ends of layers of the preliminary stacked structure STP.

Figure 10:
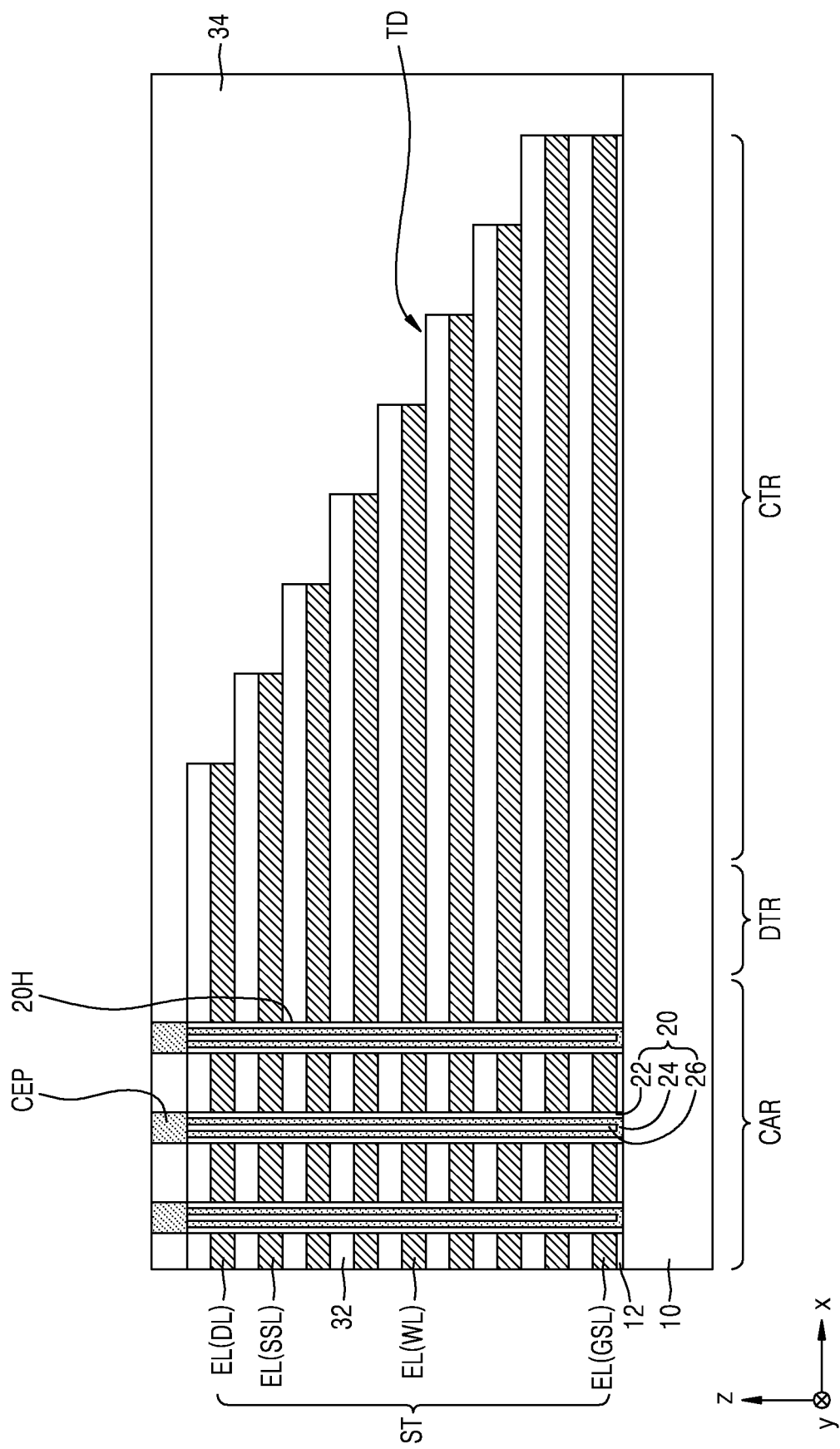

Referring to FIG. 10, the vertical structures 20, which penetrate the preliminary stacked structure (STP of FIG. 9) and are connected to the substrate 10, are formed. Each of the vertical structures 20 may include the data storage element 22, the vertical column 24, and the filling insulating layer 26. The cell pad CEP may be formed on each of the vertical structures 20.

A vertical through-hole 20H, which penetrates the first insulating layer 34 and the preliminary stacked structure STP and exposes the substrate 10, may be formed, followed by forming the data storage element 22 covering an inner side surface of the vertical through-hole 20H, and the vertical column 24 covering the data storage element 22 and having an inner hole, in this stated order. The vertical column 24 may also cover a portion of the top surface of the substrate 10 that is exposed through the vertical through-hole 20H. Then, the filling insulating layer 26 filling the inner hole of the vertical column 24 may be formed, thereby forming the vertical structure 20. The cell pad CEP filling an upper portion of the vertical through-hole 20H may be formed on the vertical structure 20. The cell pad CEP may have a vertical width (in the x-direction) that is the same as the vertical width of the vertical through-hole 20H.

Next, the sacrificial layers 31 of FIG. 9 are removed, followed by filling spaces obtained by removing the sacrificial layers 31 with the electrodes EL, thereby forming the stacked structure ST.

Figure 11:
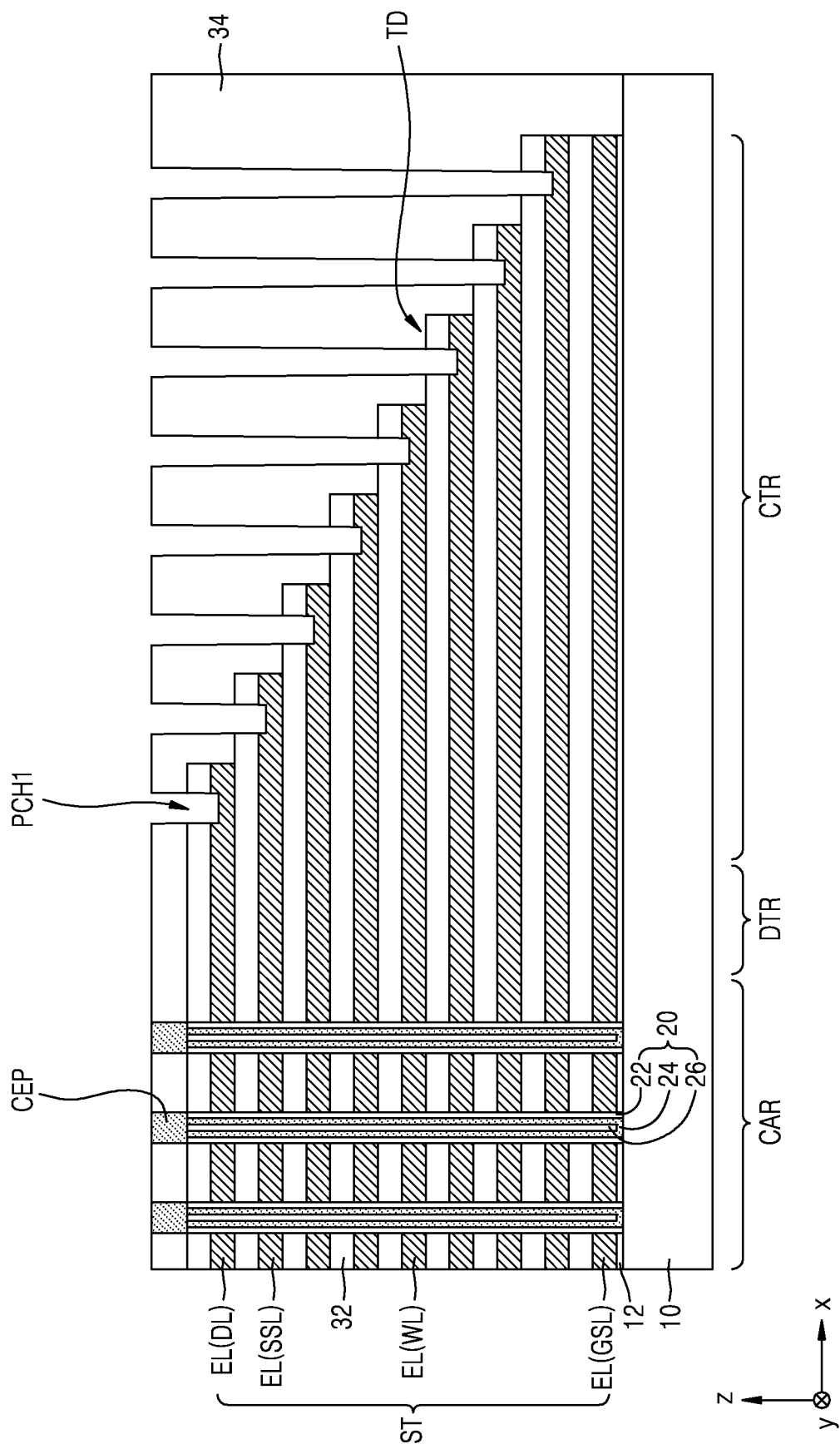

Referring to FIG. 11, a first preliminary contact hole PCH1 is formed in the contact region CTR, the first preliminary contact hole PCH1 penetrating the first insulating layer 34 and extending into an upper portion of the stacked structure ST. The first preliminary contact hole PCH1 may be formed in the region of each tread portion TD of the stepwise structure of the stacked structure ST. For example, each tread portion TD may have a first preliminary contact hole PCH1 formed therein.

The first preliminary contact hole PCH1 may be formed by partially removing the first insulating layer 34 and the electrode isolation insulating layer 32 by using the uppermost electrode EL in the region of each tread portion TD of the stacked structure ST as an etch stop layer.

In some embodiments, the first insulating layer 34 and the electrode isolation insulating layer 32 may have similar etching properties. Each electrode EL may have etch selectivity with respect to the first insulating layer 34 and the electrode isolation insulating layer 32. Thus, an etching process, in which the first insulating layer 34 and the electrode isolation insulating layer 32 are partially removed by using each electrode EL as an etch stop layer, may be performed, thereby forming first preliminary contact holes PCH1 having different depths.

Figure 12:
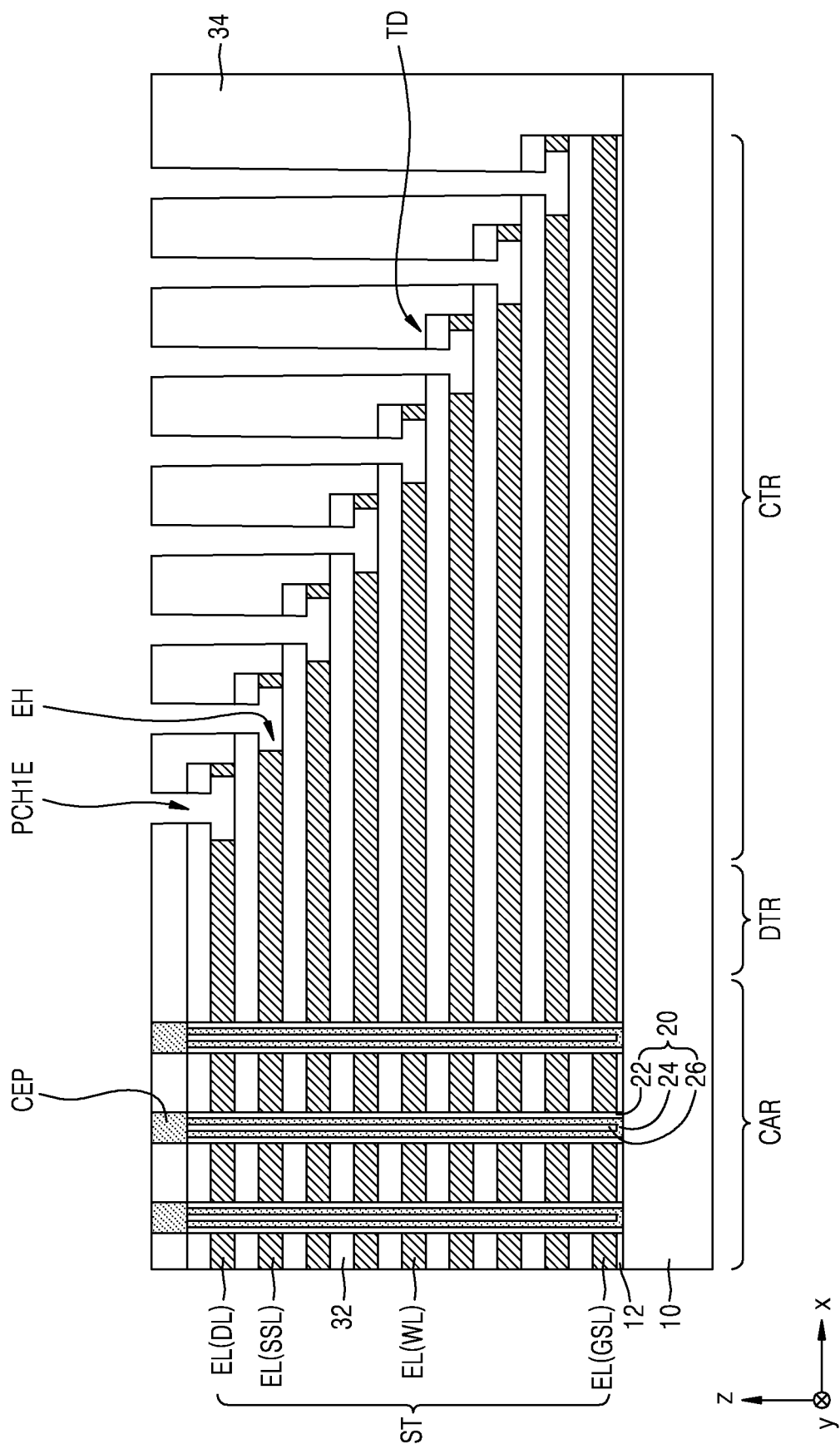

Referring to FIG. 12, the electrodes EL exposed by the first preliminary contact holes PCH1 of FIG. 11 are partially removed, thereby forming first expanded preliminary contact holes PCH1E.

The first expanded preliminary contact holes PCH1E may be formed by partially removing the electrodes EL by isotropic etching. Thus, a first expanded preliminary contact hole PCH1E may have an expanded hole EH in a lower portion thereof, the expanded hole EH horizontally extending further than an upper portion thereof. Therefore, the lower portion of the first expanded preliminary contact hole PCH1E may have a greater width than the upper portion thereof, the lower portion corresponding to each electrode EL. The expanded hole EH may be formed in an uppermost one of the electrodes EL in each tread portion TD of the stacked structure ST. For example, when the tread portion TD of the stacked structure ST includes two electrodes EL, the expanded hole EH may be formed in the uppermost one of the two electrodes EL.

Figure 13:
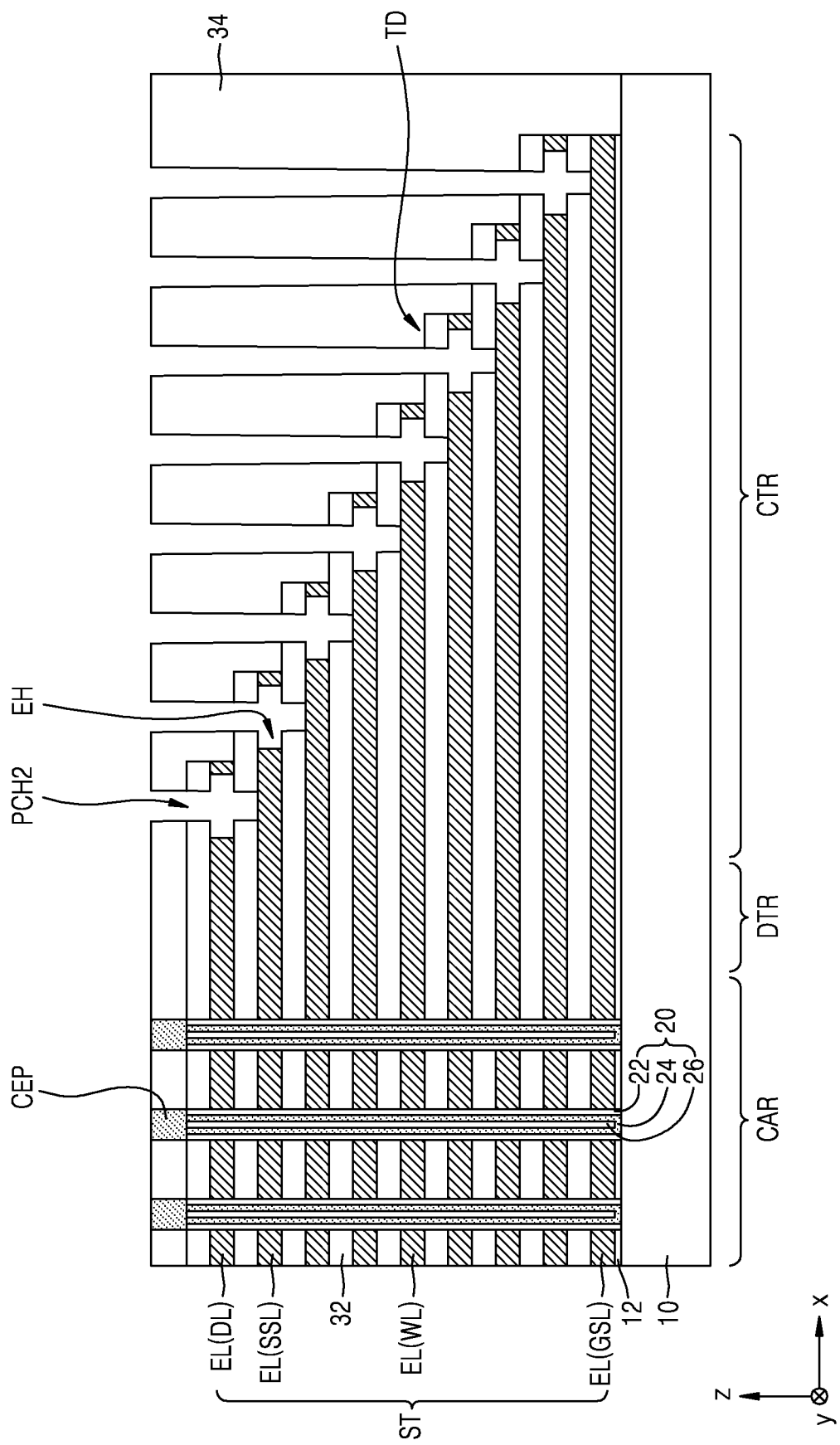

Referring to FIG. 13, the electrode isolation insulating layer 32 exposed at a bottom surface of the first expanded preliminary contact hole PCH1E is partially removed, thereby forming a second preliminary contact hole PCH2. The second preliminary contact hole PCH2 may be formed by partially removing the electrode isolation insulating layer 32 by anisotropic etching. A top surface of the lowermost electrode EL in the tread portion TD may be partially exposed at the bottom surface of the second preliminary contact hole PCH2.

Thus, in the second preliminary contact hole PCH2, a middle portion having the expanded hole EH may have a greater width than each of upper and lower portions.

Figure 14:
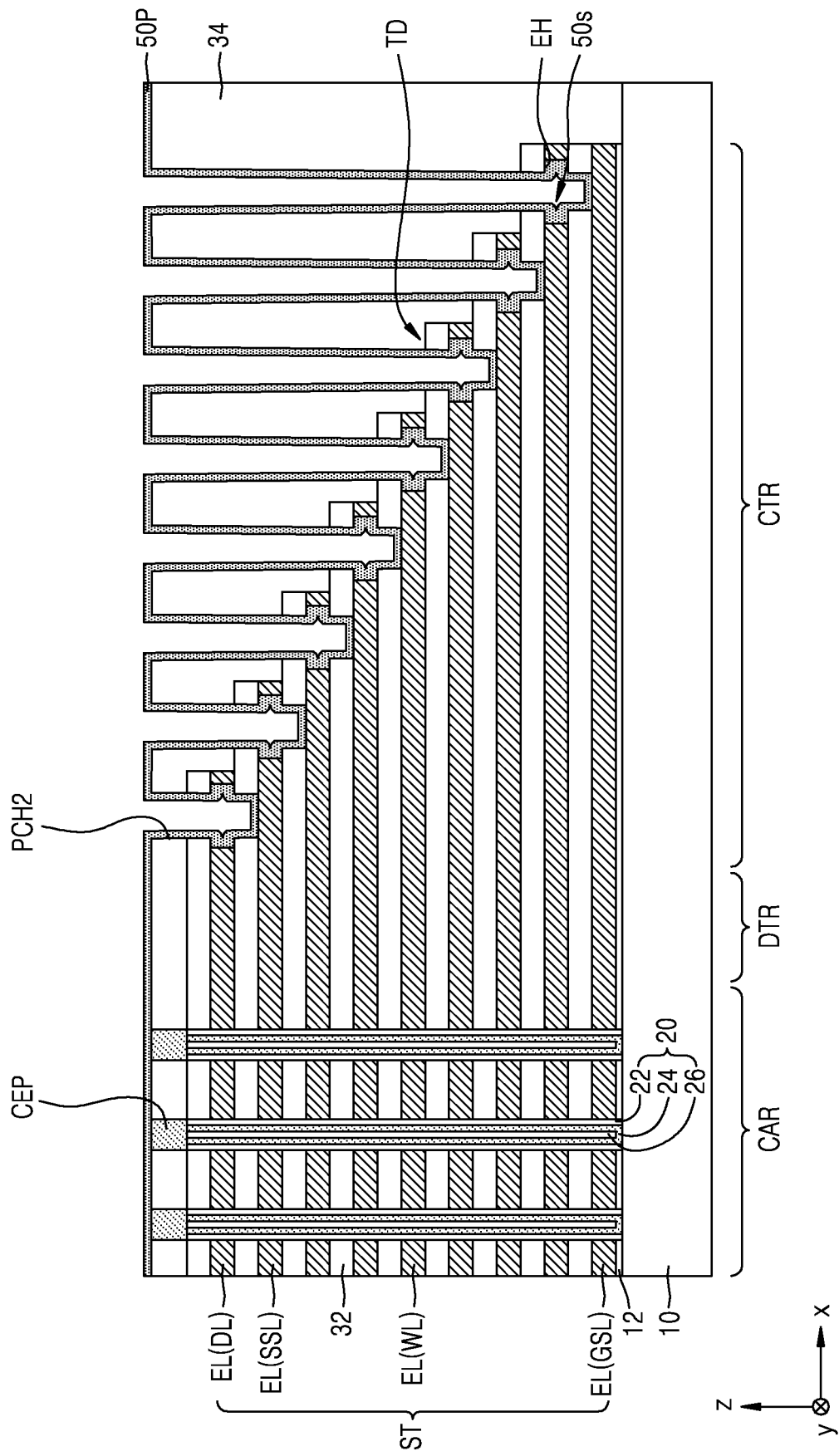

Referring to FIG. 14, an insulating cover layer 50P, which covers inner surfaces of the second preliminary contact hole PCH2, is formed. The insulating cover layer 50P may conformally cover exposed surfaces in the second preliminary contact hole PCH2. Thus, the insulating cover layer 50P may have the slit 50s extending into the expanded hole EH.

Figure 15:
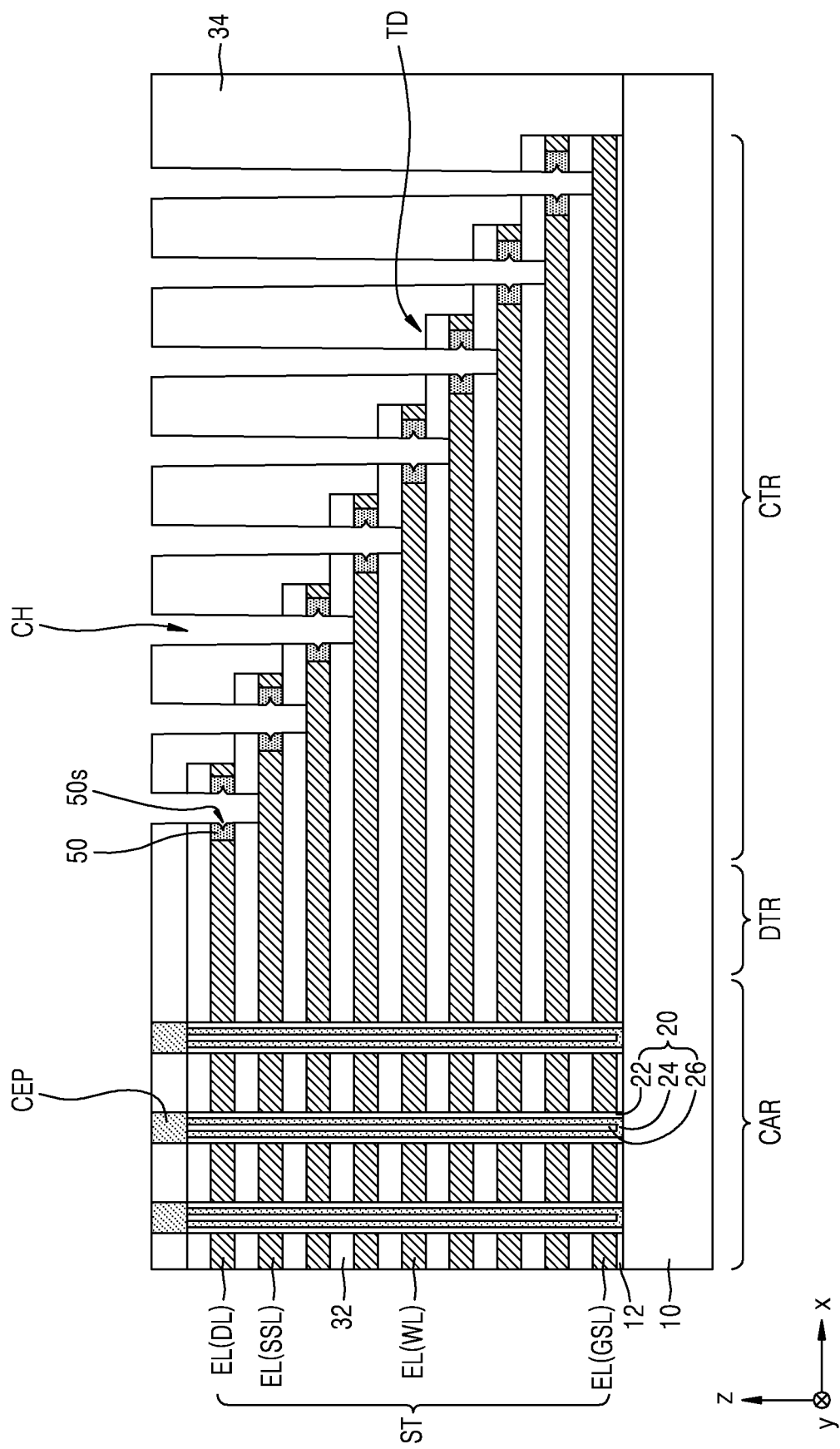

Referring to FIG. 15, the insulating cover layer (50P of FIG. 14) is partially removed, thereby forming the insulating barrier layer 50, which fills the expanded hole EH, and forming a contact hole CH.

The insulating barrier layer 50 may be formed by removing a portion of the insulating cover layer 50P, which covers a bottom surface of a second preliminary contact hole PCH2, and a portion of the insulating cover layer 50P, which covers a side surface of each of the electrode isolation insulating layer 32 and the first insulating layer 34. The insulating barrier layer 50 may correspond to a portion of the insulating cover layer 50P which fills the expanded hole EH. As shown in FIG. 14, when the slit 50s of the insulating cover layer 50P extends into the expanded hole EH, the insulating barrier layer 50 may also have the slit 50s.

The top surface of the lowermost electrode EL in the tread portion TD may be exposed at a bottom surface of the contact hole CH. The electrode EL over the electrode EL having the top surface exposed at the bottom surface of the contact hole CH may be covered with the insulating barrier layer 50 and thus not be exposed in the contact hole CH.

Figure 16:
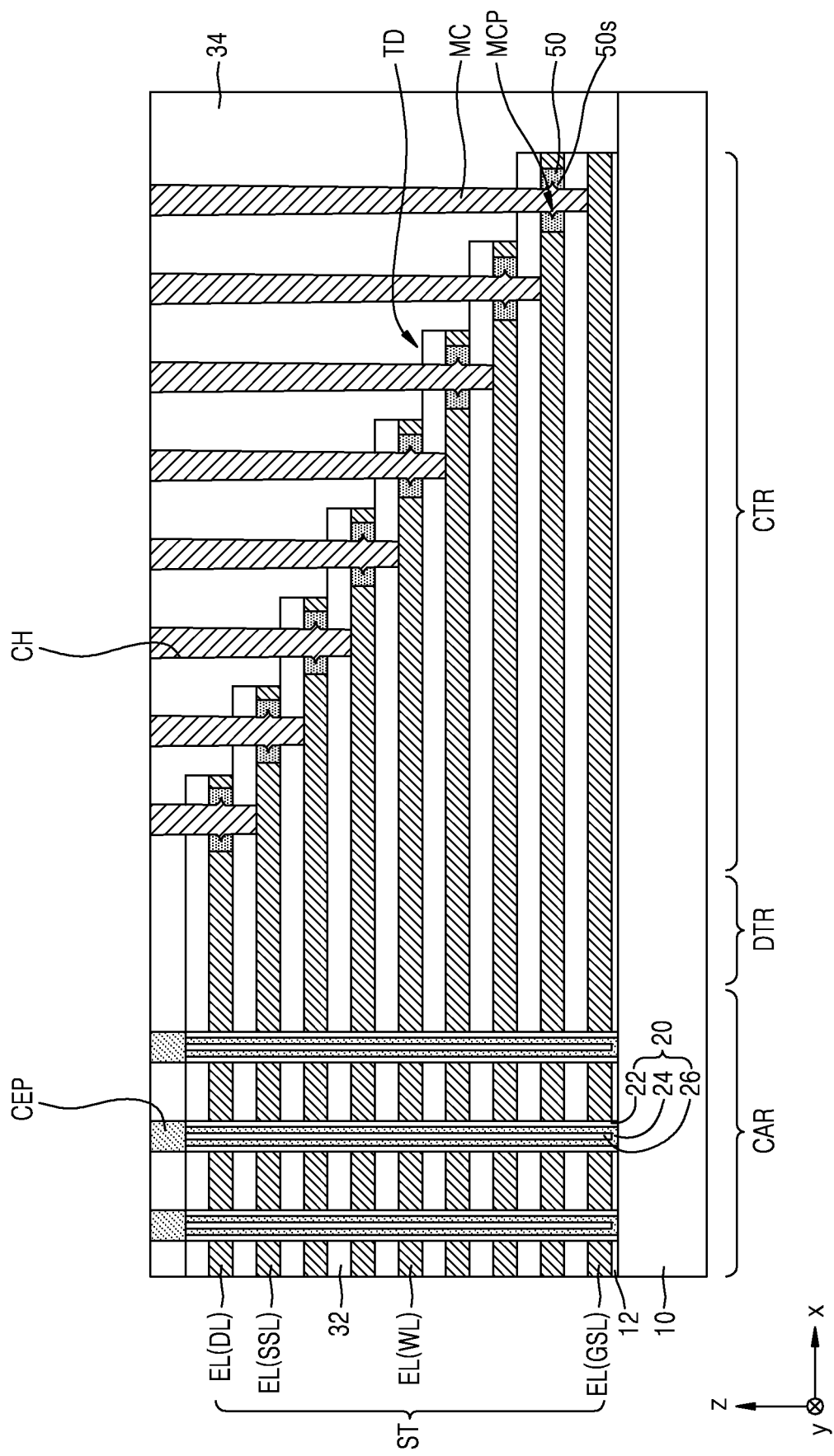

Referring to FIG. 16, a conductive material fills the contact hole CH, thereby forming the contact plug MC. The contact plug MC may penetrate the uppermost electrode EL in the region of each tread portion TD of the stepwise structure of the stacked structure ST, and thus be connected to the electrode EL under the penetrated electrode EL. The insulating barrier layer 50 may be arranged between the contact plug MC and the electrode EL penetrated by the contact plug MC.

The contact plug MC may have the plug protrusion MCP corresponding to the slit 50s of the insulating barrier layer 50. The plug protrusion MCP may have a shape protruding toward the electrode EL penetrated by the contact plug MC.

Figure 17:
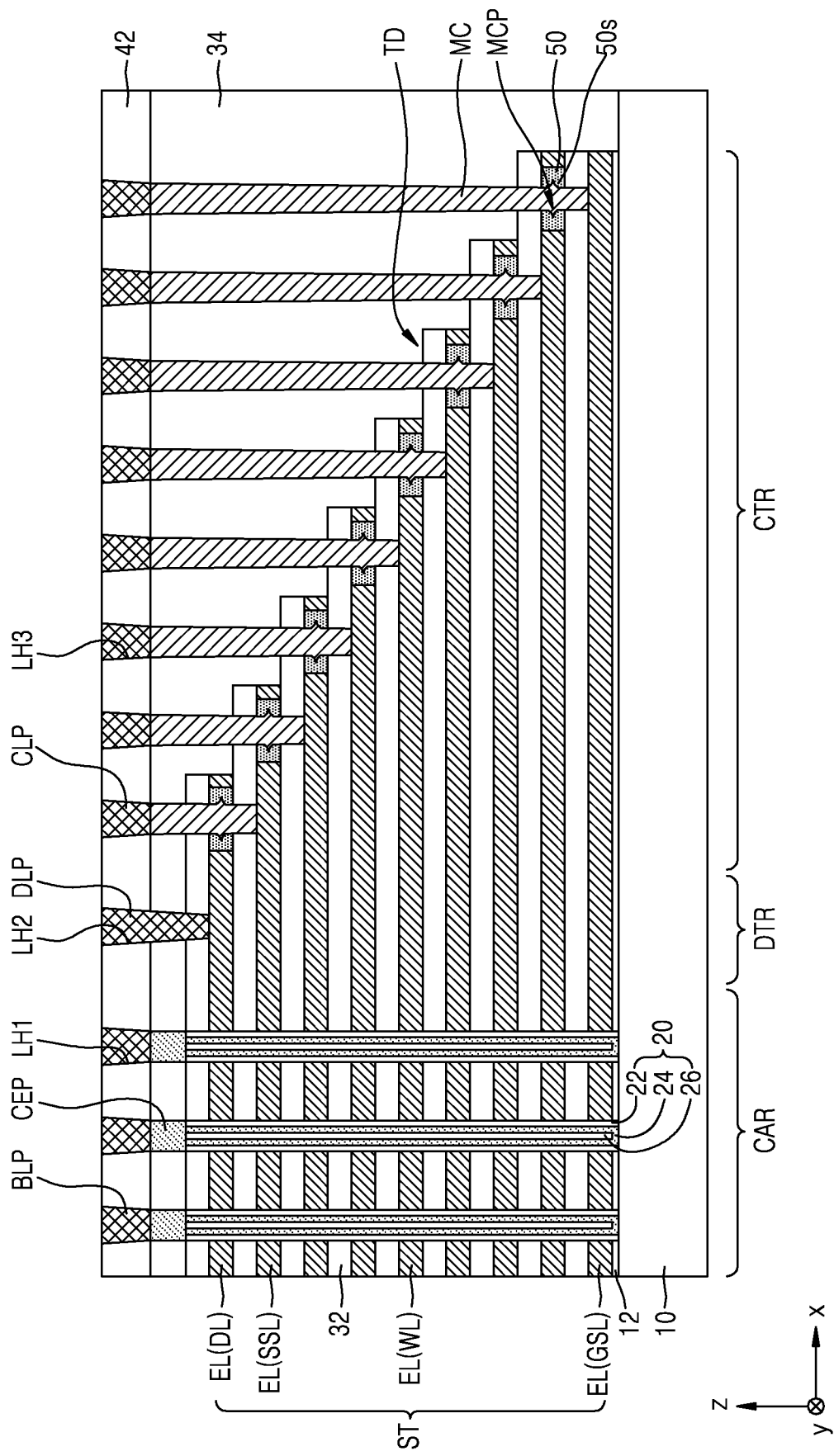

Referring to FIG. 17, the second insulating layer 42, which covers the first insulating layer 34, is formed, followed by forming landing plug holes LH1, LH2, and LH3, which penetrate the second insulating layer 42.

The landing plug holes LH1, LH2, and LH3 include a first landing plug hole LH1, a second landing plug hole LH2, and a third landing plug hole LH3, which are respectively formed in the cell array region CAR, the dummy contact region DTR, and the contact region CTR.

The first landing plug hole LH1 may penetrate the second insulating layer 42 in the cell array region CAR, and expose the cell pad CEP at a bottom surface of the first landing plug hole LH1. The second landing plug hole LH2 may penetrate the second insulating layer 42, the first insulating layer 34, and the electrode isolation insulating layer 32 in the dummy contact region DTR, and expose the uppermost electrode EL of the stack of electrodes EL (i.e., the dummy select line DL at a bottom surface of the second landing plug hole LH2). The third landing plug hole LH3 may penetrate the second insulating layer 42 in the contact region CTR, and expose the contact plug MC at a bottom surface of the third landing plug hole LH3. The depth of the second landing plug hole LH2 may be greater than depths of the first and third landing plug holes LH1 and LH3. The landing plug holes LH1, LH2, and LH3 may be formed by partially removing the second insulating layer 42 or partially removing the first and second insulating layers 34 and 42 and the electrode isolation insulating layer 32 by respectively using the cell pad CEP, the dummy select line DL, and the contact plug MC as etch stop layers.

Next, a conductive material fills the first to third landing plug holes LH1, LH2, and LH3, thereby respectively forming the bit line landing plug BLP, the dummy landing plug DLP, and the contact landing plug CLP. The top surfaces of the bit line landing plug BLP, the dummy landing plug DLP, and the contact landing plug CLP may be substantially on a same plane.

Next, as shown in FIG. 4, the connection lines BL, DCL, and CCL and the wiring insulating layer 44 filling the spaces therebetween are formed on the second insulating layer 42 and the landing plugs BLP, DLP, and CLP, thereby forming the three-dimensional semiconductor device 100.

As described with reference to FIGS. 9 to 17, even though the three-dimensional semiconductor device 100 includes the contact plugs MC having different heights, the first preliminary contact holes PCH1 having different depths may be formed by using the uppermost electrode EL in the region of each tread portion TD of the stacked structure ST as an etch stop layer. Thus, since each contact plug MC may be prevented from penetrating the electrode EL connected thereto to cause damage to the electrode isolation insulating layer 32 under the electrode EL or to be connected to another electrode EL under the electrode EL, the three-dimensional semiconductor device 100 may secure electrical reliability.

Figure 18:
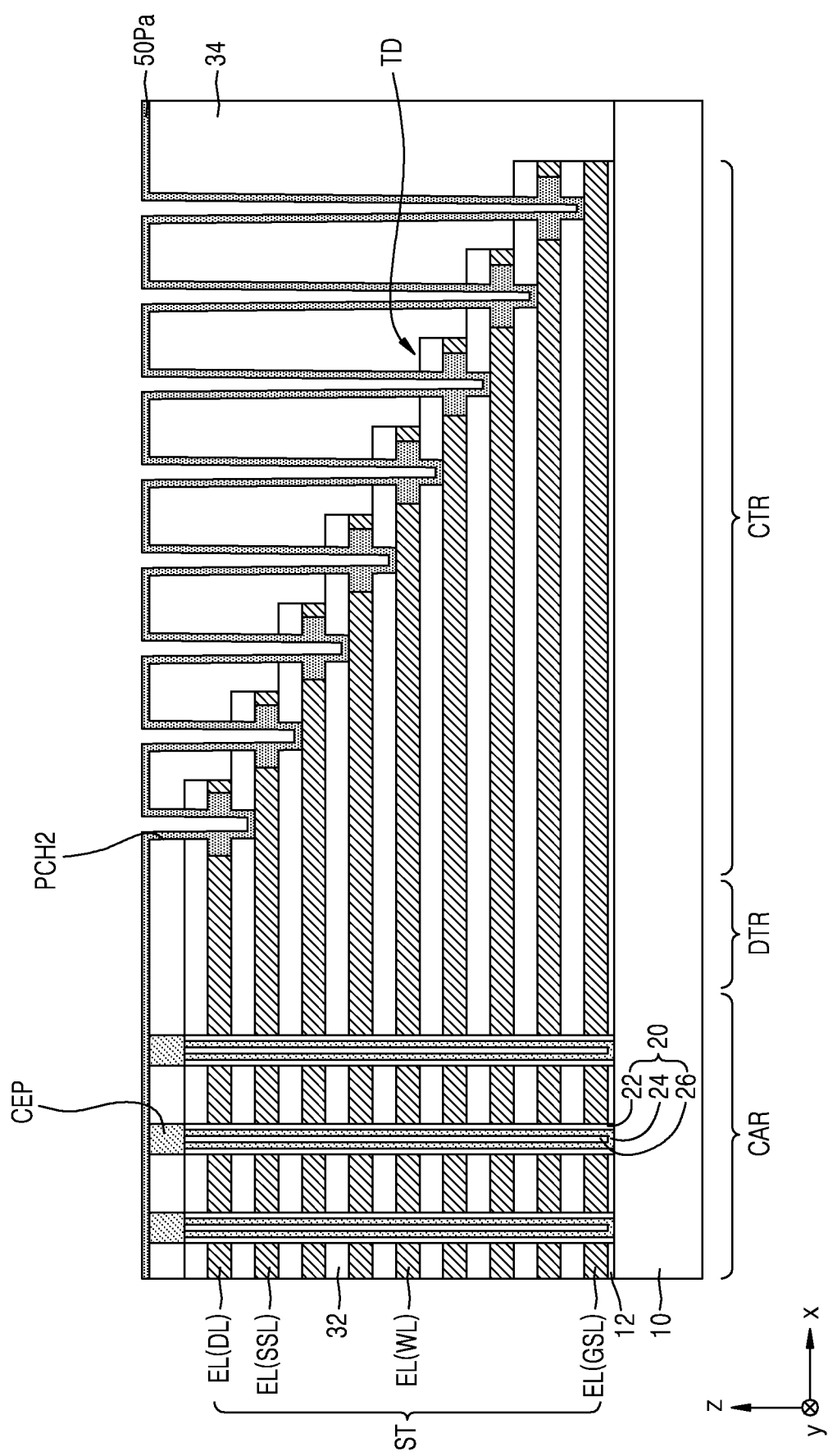
FIG. 18 is a cross-sectional view illustrating a method of fabricating a three-dimensional semiconductor device, according to an exemplary embodiment.

FIG. 18 is a cross-sectional view illustrating a method of fabricating a three-dimensional semiconductor device, according to an exemplary embodiment. Specifically, FIG. 18 is a cross-sectional view illustrating a method of fabricating the three-dimensional semiconductor device 100a according to an embodiment, shown in FIG. 5, and is also a cross-sectional view illustrating a process after the process steps depicted in FIG. 13. In descriptions with reference to FIG. 18, descriptions overlapping with the descriptions with reference to FIGS. 5 and 9 to 13 may be omitted, and like components will be denoted by like reference numerals unless otherwise stated.

Referring to FIG. 18, an insulating cover layer 50Pa, which covers the inner surface of the second preliminary contact hole PCH2, is formed. The insulating cover layer 50Pa may conformally cover the exposed surfaces in the second preliminary contact hole PCH2. The insulating cover layer 50Pa may be formed such that a slit does not extend into the expanded hole EH.

Next, in a similar manner to that described with reference to FIG. 15, the insulating barrier layer 50a may be formed by partially removing the insulating cover layer 50Pa. For example, the insulating barrier layer 50a may be formed by removing a portion of the insulating cover layer 50Pa, which covers a bottom surface of a second preliminary contact hole PCH2, and a portion of the insulating cover layer 50Pa, which covers a side surface of each of the electrode isolation insulating layer 32 and the first insulating layer 34. Then, the process may continue such that the three-dimensional semiconductor device 100a shown in FIG. 5 may be formed based on the descriptions with reference to FIGS. 16 and 17.

Figure 19:
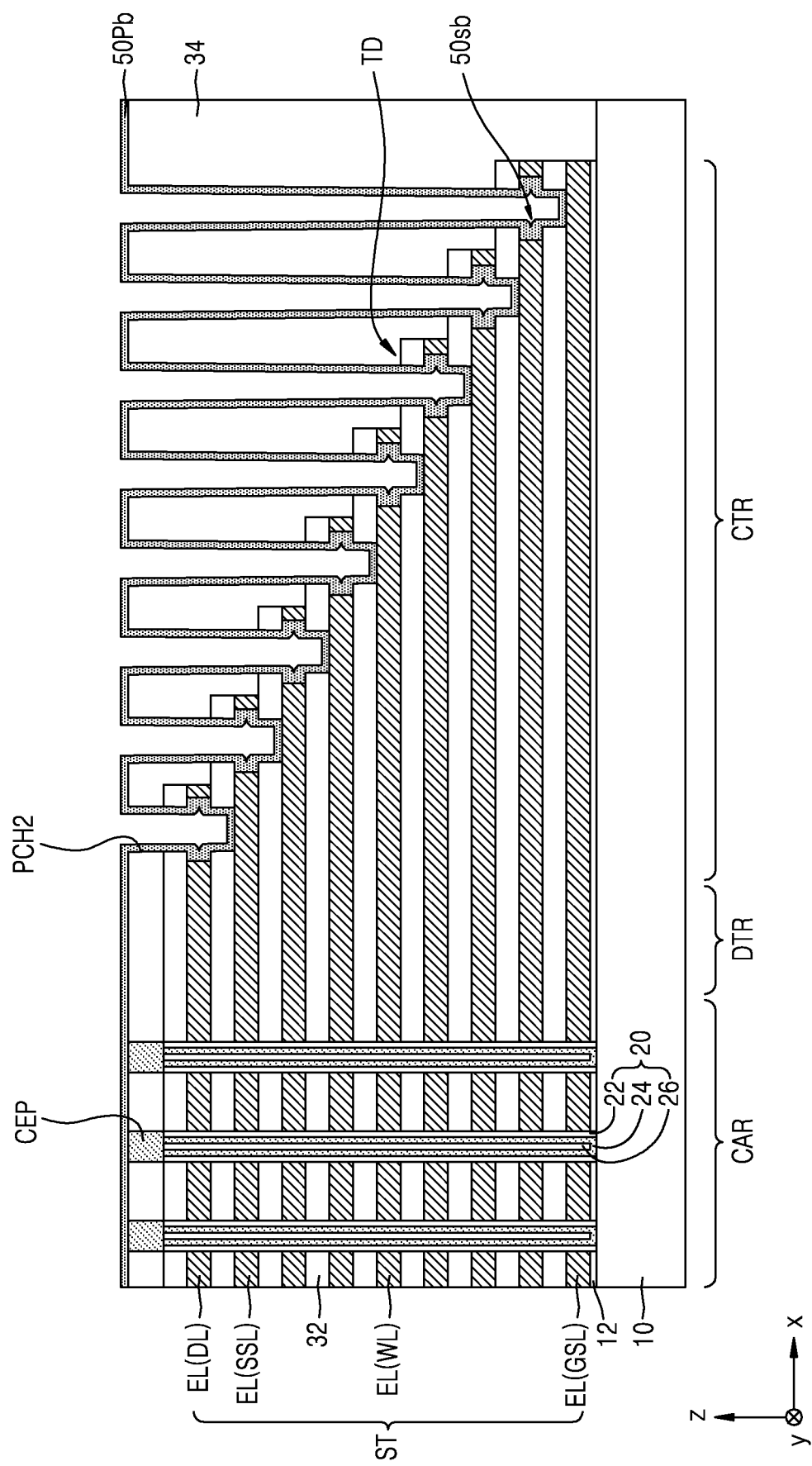
FIG. 19 is a cross-sectional view illustrating a method of fabricating a three-dimensional semiconductor device, according to an exemplary embodiment.

FIG. 19 is a cross-sectional view illustrating a method of fabricating a three-dimensional semiconductor device, according to an exemplary embodiment. Specifically, FIG. 19 is a cross-sectional view illustrating a method of fabricating the three-dimensional semiconductor device 100b according to an embodiment shown in FIG. 6, and is also a cross-sectional view illustrating a process after the process steps depicted in FIG. 13. In descriptions with reference to FIG. 19, descriptions overlapping with the descriptions with reference to FIGS. 6 and 9 to 13 may be omitted, and like components will be denoted by like reference numerals unless otherwise stated.

Referring to FIG. 19, an insulating cover layer 50Pb, which covers the inner surface of the second preliminary contact hole PCH2, is formed. The insulating cover layer 50Pb may conformally cover the exposed surfaces in the second preliminary contact hole PCH2. The insulating cover layer 50Pb may have the slit 50sb extending toward the expanded hole EH.

Next, the insulating barrier layer 50b having the slit 50sb, and the contact spacer 52, as shown in FIG. 6, may be formed by removing portions of the insulating cover layer 50Pb covering a bottom surface of the second preliminary contact hole PCH2 and a top surface of each of the first insulating layer 34 and the cell pad CEP, and the three-dimensional semiconductor device 100b shown in FIG. 6 may be formed based on the descriptions with reference to FIGS. 16 and 17.

Figure 20:
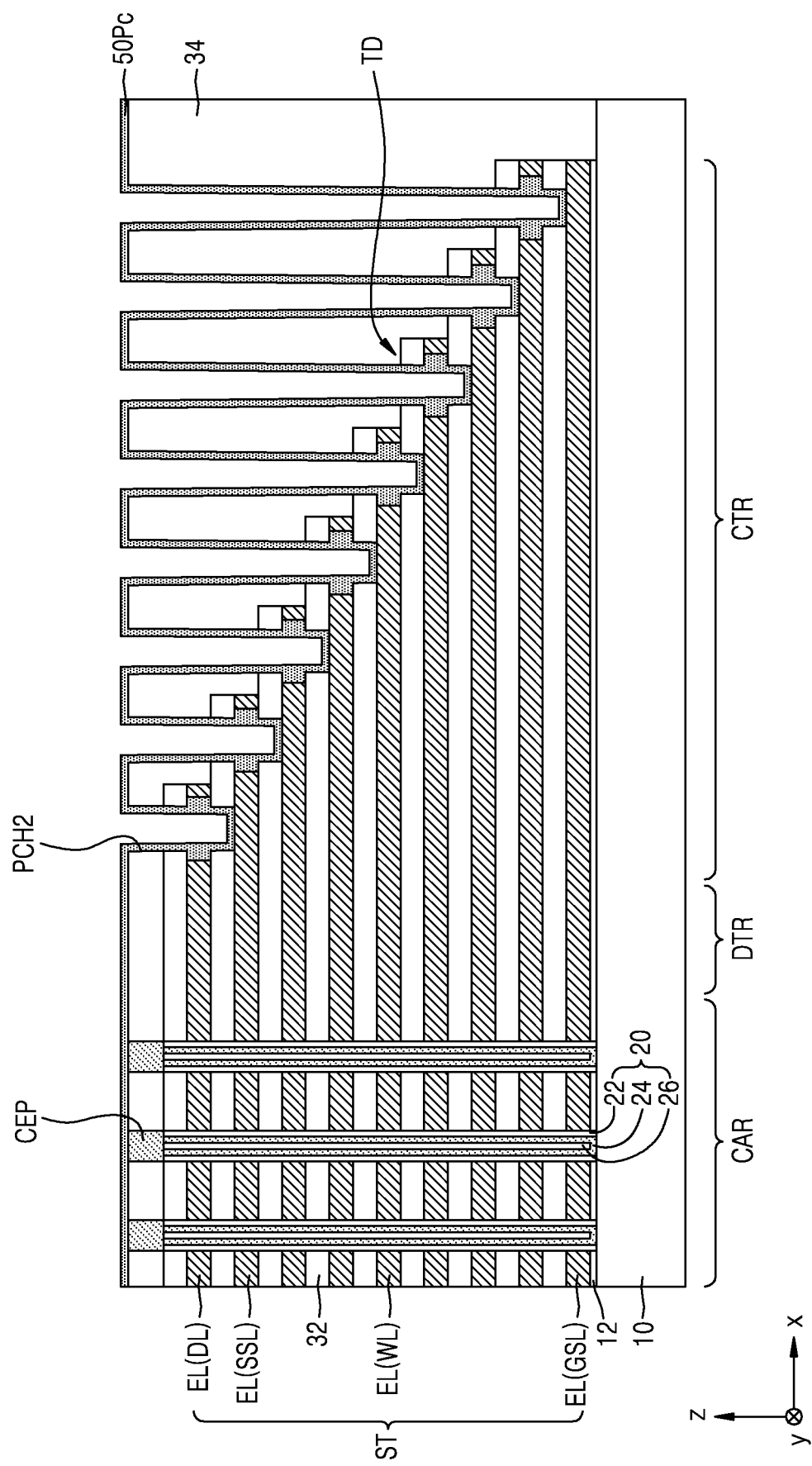
FIG. 20 is a cross-sectional view illustrating a method of fabricating a three-dimensional semiconductor device, according to an exemplary embodiment.

FIG. 20 is a cross-sectional view illustrating a method of fabricating a three-dimensional semiconductor device, according to an exemplary embodiment. Specifically, FIG. 20 is a cross-sectional view illustrating a method of fabricating the three-dimensional semiconductor device 100c according to an embodiment shown in FIG. 7, and is also a cross-sectional view illustrating a process after the process steps depicted in FIG. 13. In descriptions with reference to FIG. 20, descriptions overlapping with the descriptions with reference to FIGS. 7 and 9 to 13 may be omitted, and like components will be denoted by like reference numerals unless otherwise stated.

Referring to FIG. 20, an insulating cover layer 50Pc, which covers the inner surface of the second preliminary contact hole PCH2, is formed. The insulating cover layer 50Pc may conformally cover the exposed surfaces in the second preliminary contact hole PCH2. The insulating cover layer 50Pc may fill the expanded hole EH, and may not have a slit such as the slits 50s or 50sb shown in FIGS. 17 and 19.

Next, the insulating barrier layer 50c and the contact spacer 52, as shown in FIG. 7, may be formed by removing portions of the insulating cover layer 50Pc covering the bottom surface of the second preliminary contact hole PCH2 and the top surface of each of the first insulating layer 34 and the cell pad CEP, and the three-dimensional semiconductor device 100c shown in FIG. 7 may be formed based on the descriptions with reference to FIGS. 16 and 17.

FIGS. 21 to 27 are cross-sectional views illustrating a method of fabricating a three-dimensional semiconductor device, according to an exemplary embodiment. Specifically, FIGS. 21 to 27 are cross-sectional views illustrating a method of fabricating the three-dimensional semiconductor device 102 according to an embodiment shown in FIG. 8, and are also cross-sectional views illustrating processes after FIG. 10. In descriptions with reference to FIGS. 21 to 27, descriptions overlapping with the descriptions with reference to FIGS. 8 to 10 may be omitted, and like components will be denoted by like reference numerals unless otherwise stated.

Figure 21:
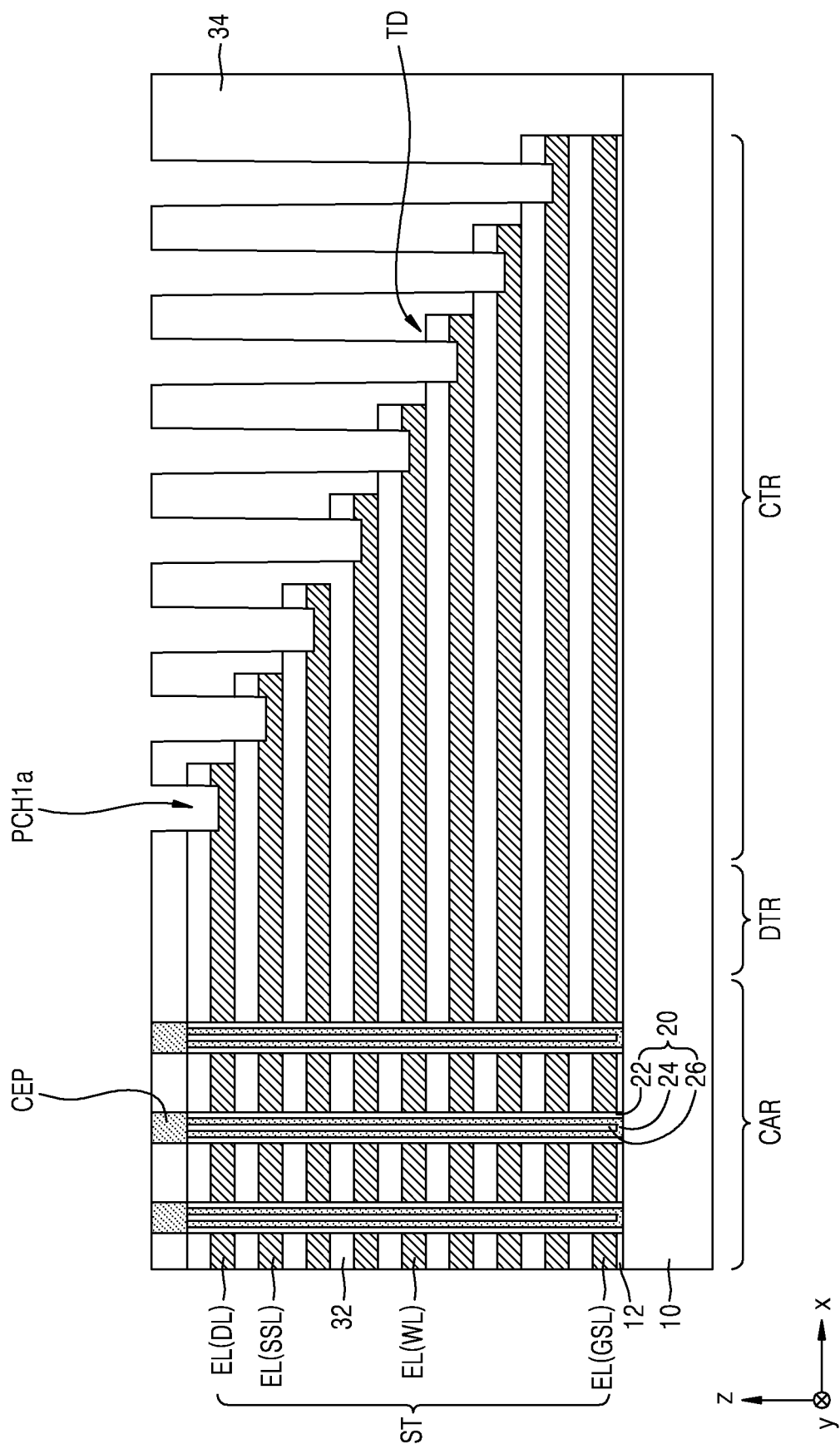
FIGS. 21 to 27 are cross-sectional views illustrating a method of fabricating a three-dimensional semiconductor device, according to an exemplary embodiment.

Referring to FIG. 21, a first preliminary contact hole PCH1a is formed in the contact region CTR, the first preliminary contact hole PCH1a penetrating the first insulating layer 34 and extending into the upper portion of the stacked structure ST. The first preliminary contact hole PCH1a may be formed in the region of each tread portion TD of the stepwise structure of the stacked structure ST.

The first preliminary contact hole PCH1a may be formed by partially removing the first insulating layer 34 and the electrode isolation insulating layer 32 by using the uppermost electrode EL in the region of each tread portion TD of the stacked structure ST as an etch stop layer.

Figure 22:
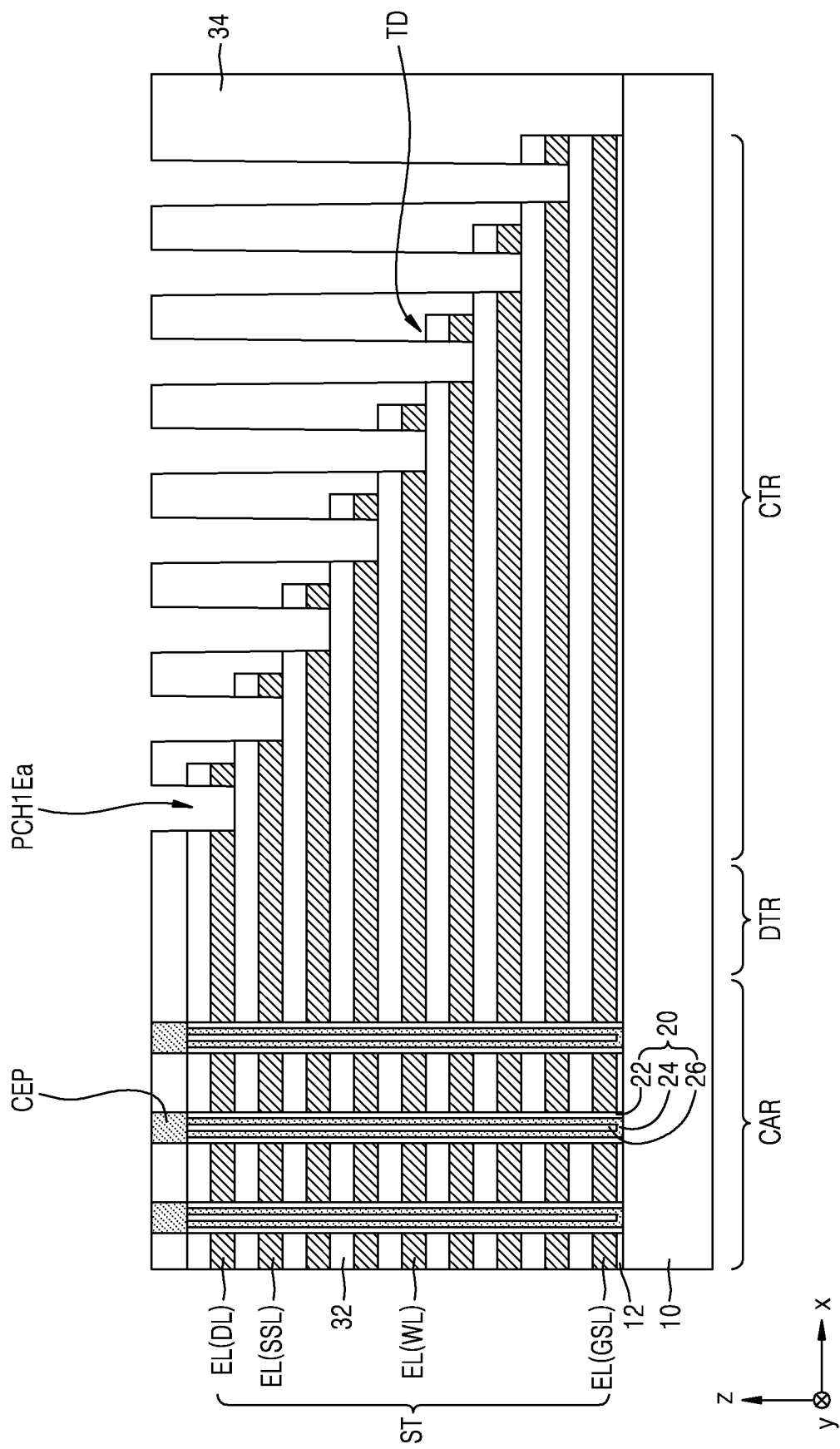

Referring to FIG. 22, the electrodes EL exposed by first preliminary contact holes PCH1a of FIG. 21 are partially removed, thereby forming first expanded preliminary contact holes PCH1Ea.

The first expanded preliminary contact holes PCH1Ea may be formed by partially removing the electrodes EL by anisotropic etching. A first expanded preliminary contact hole PCH1Ea may have a tapered shape having a decreasing horizontal cross-sectional area from top to bottom. For example, a width (in the x-direction) of the expanded preliminary contact hole PCH1Ea may be greater at cross-sections further away from the substrate 10 in the z-direction, and a width (in the x-direction) of the expanded preliminary contact hole PCH1Ea may be smaller at cross-sections nearer to the substrate 10 in the z-direction.

Figure 23:
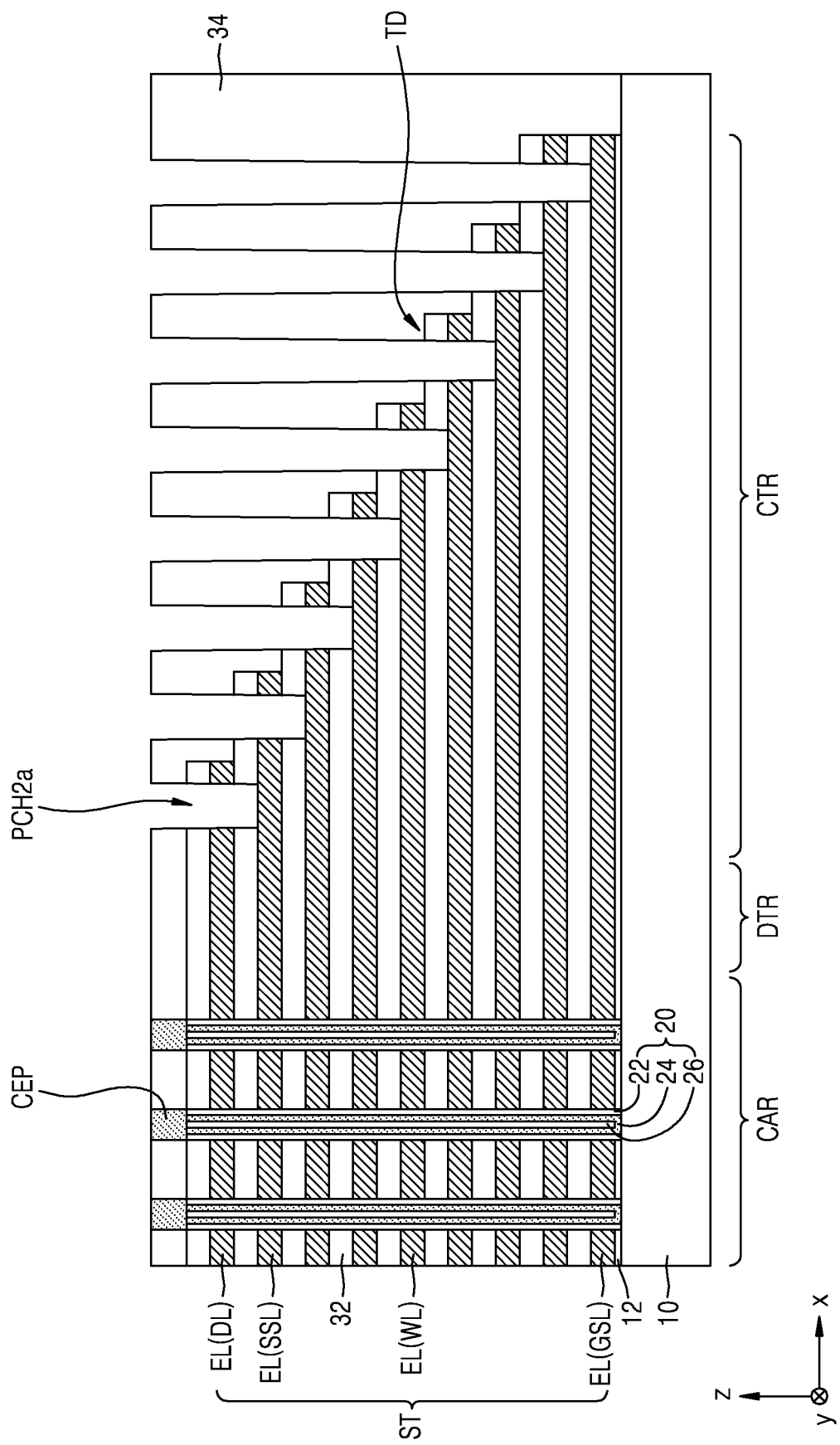

Referring to FIG. 23, the electrode isolation insulating layer 32 exposed at a bottom surface of the first expanded preliminary contact hole PCH1Ea of FIG. 22 is partially removed, thereby forming a second preliminary contact hole PCH2a. The second preliminary contact hole PCH2a may be formed by partially removing the electrode isolation insulating layer 32 by anisotropic etching. The top surface of the bottommost electrode EL in the tread portion TD may be partially exposed at the bottom surface of the second preliminary contact hole PCH2a.

The second preliminary contact hole PCH2a may have a tapered shape having a decreasing horizontal cross-sectional area from top to bottom. For example, a width (in the x-direction) of the second preliminary contact hole PCH2a may be greater at cross-sections further away from the substrate 10 in the z-direction, and a width (in the x-direction) of the second preliminary contact hole PCH2a may be smaller at cross-sections nearer to the substrate 10 in the z-direction.

Figure 24:
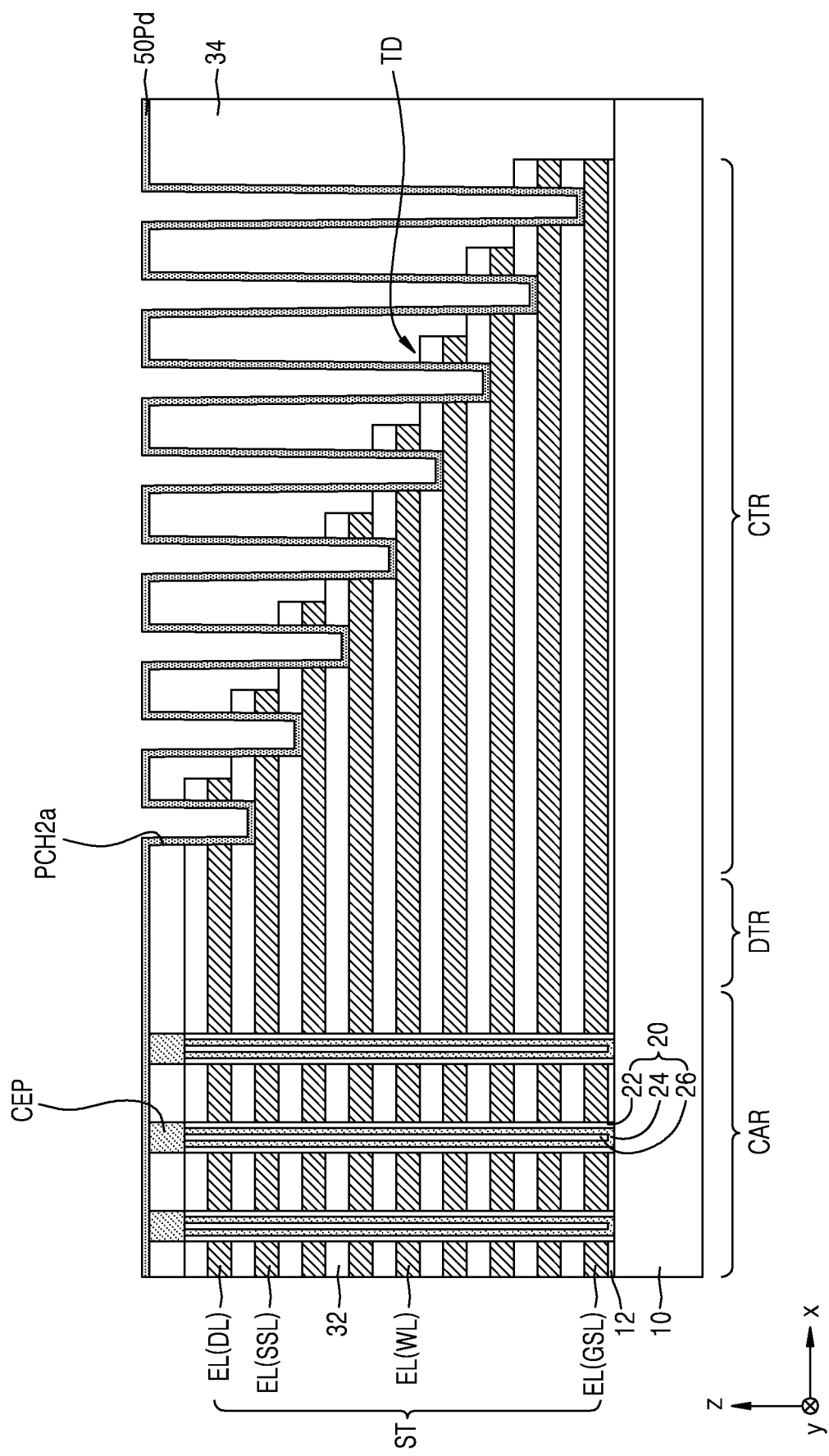

Referring to FIG. 24, an insulating cover layer 50Pd, which covers inner surfaces of the second preliminary contact hole PCH2a, is formed. The insulating cover layer 50Pd may conformally cover exposed surfaces in the second preliminary contact hole PCH2.

Figure 25:
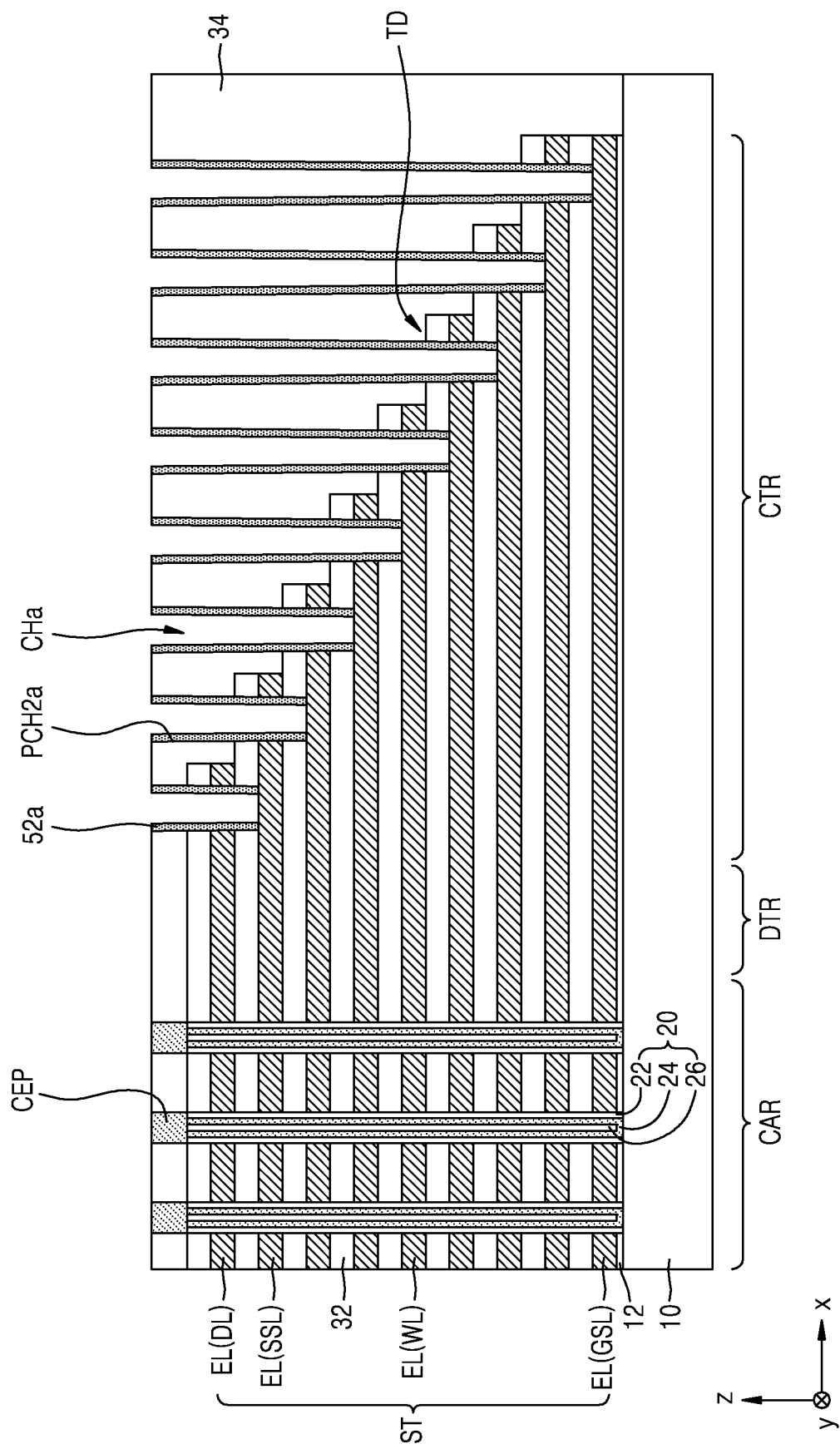

Referring to FIG. 25, portions of the insulating cover layer 50Pd, which covers the bottom surface of the second preliminary contact hole PCH2a and the top surface of each of the first insulating layer 34 and the cell pad CEP, are removed, thereby forming the contact spacer 52a, which covers an inner side surface of the second preliminary contact hole PCH2a. The contact spacer 52a may define a contact hole CHa partially exposing the top surface of the electrode EL at a bottom surface of the contact hole CHa.

Figure 26:
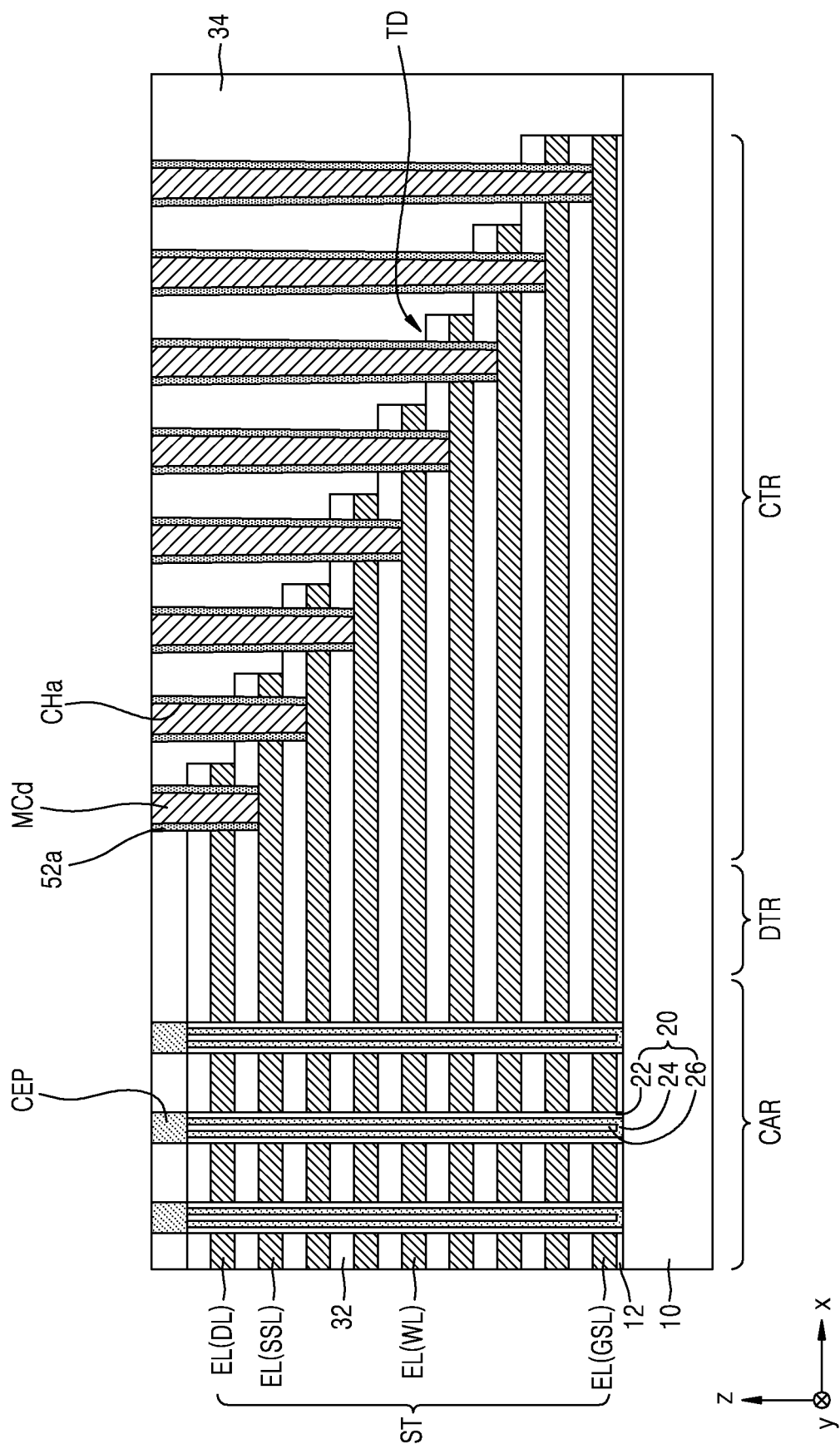

Referring to FIG. 26, a conductive material fills the contact hole CHa, thereby forming the contact plug MCd. The contact plug MCd may penetrate the uppermost electrode EL in the region of each tread portion TD of the stepwise structure of the stacked structure ST, and thus be connected to the electrode EL under the penetrated electrode EL. The contact plug MCd may be a single homogeneous unit extending from the top surface of the first insulating layer 34 to the top surface of the bottommost electrode EL in the tread region TD. The contact spacer 52a may surround the side surface of the contact plug MCd.

Figure 27:
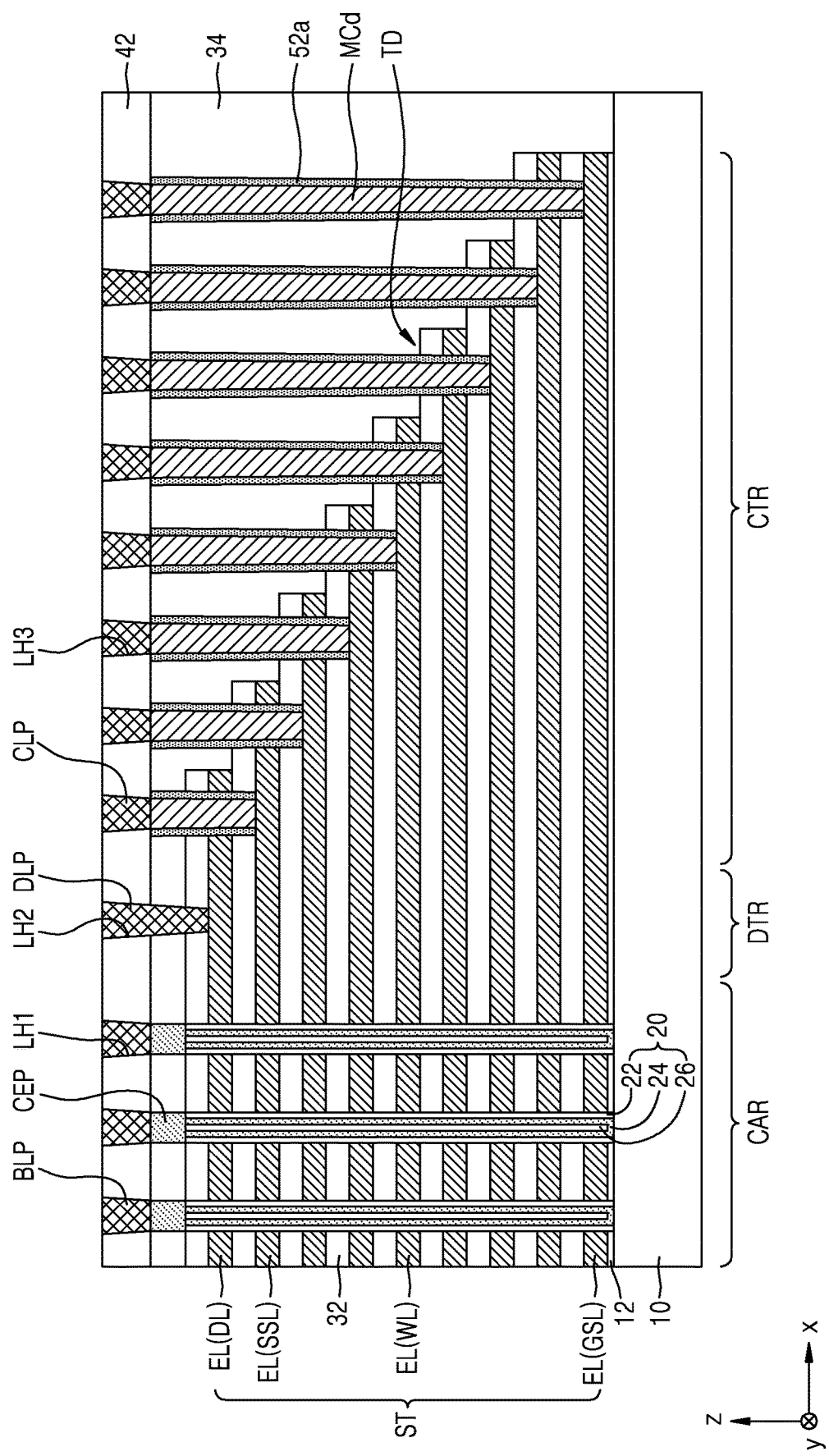

Referring to FIG. 27, the second insulating layer 42, which covers the first insulating layer 34, is formed, followed by forming the landing plug holes LH1, LH2, and LH3, which penetrate the second insulating layer 42.

The landing plug holes LH1, LH2, and LH3 include the first landing plug hole LH1, the second landing plug hole LH2, and the third landing plug hole LH3, which are respectively formed in the cell array region CAR, the dummy contact region DTR, and the contact region CTR.

The first landing plug hole LH1 may penetrate the second insulating layer 42 in the cell array region CAR, and expose the cell pad CEP at the bottom surface of the first landing plug hole LH1. The second landing plug hole LH2 may penetrate the second insulating layer 42, the first insulating layer 34, and the electrode isolation insulating layer 32 in the dummy contact region DTR, and expose the uppermost electrode EL, that is, the dummy select line DL at the bottom surface of the second landing plug hole LH2. The third landing plug hole LH3 may penetrate the second insulating layer 42 in the contact region CTR, and expose the contact plug MCd at the bottom surface of the third landing plug hole LH3. The depth of the second landing plug hole LH2 may be greater than the depths of the first and third landing plug holes LH1 and LH3. The landing plug holes LH1, LH2, and LH3 may be formed by partially removing the second insulating layer 42 or partially removing the first and second insulating layers 34 and 42 and the electrode isolation insulating layer 32 by respectively using the cell pad CEP, the dummy select line DL, and the contact plug MCd as etch stop layers.

Next, a conductive material fills the first to third landing plug holes LH1, LH2, and LH3, thereby respectively forming the bit line landing plug BLP, the dummy landing plug DLP, and the contact landing plug CLP. The top surfaces of the bit line landing plug BLP, the dummy landing plug DLP, and the contact landing plug CLP may be substantially on a same plane.

Next, as shown in FIG. 8, the connection lines BL, DCL, and CCL and the wiring insulating layer 44 filling the spaces therebetween are formed on the second insulating layer 42 and the landing plugs BLP, DLP, and CLP, thereby forming the three-dimensional semiconductor device 102.

Figure 28:
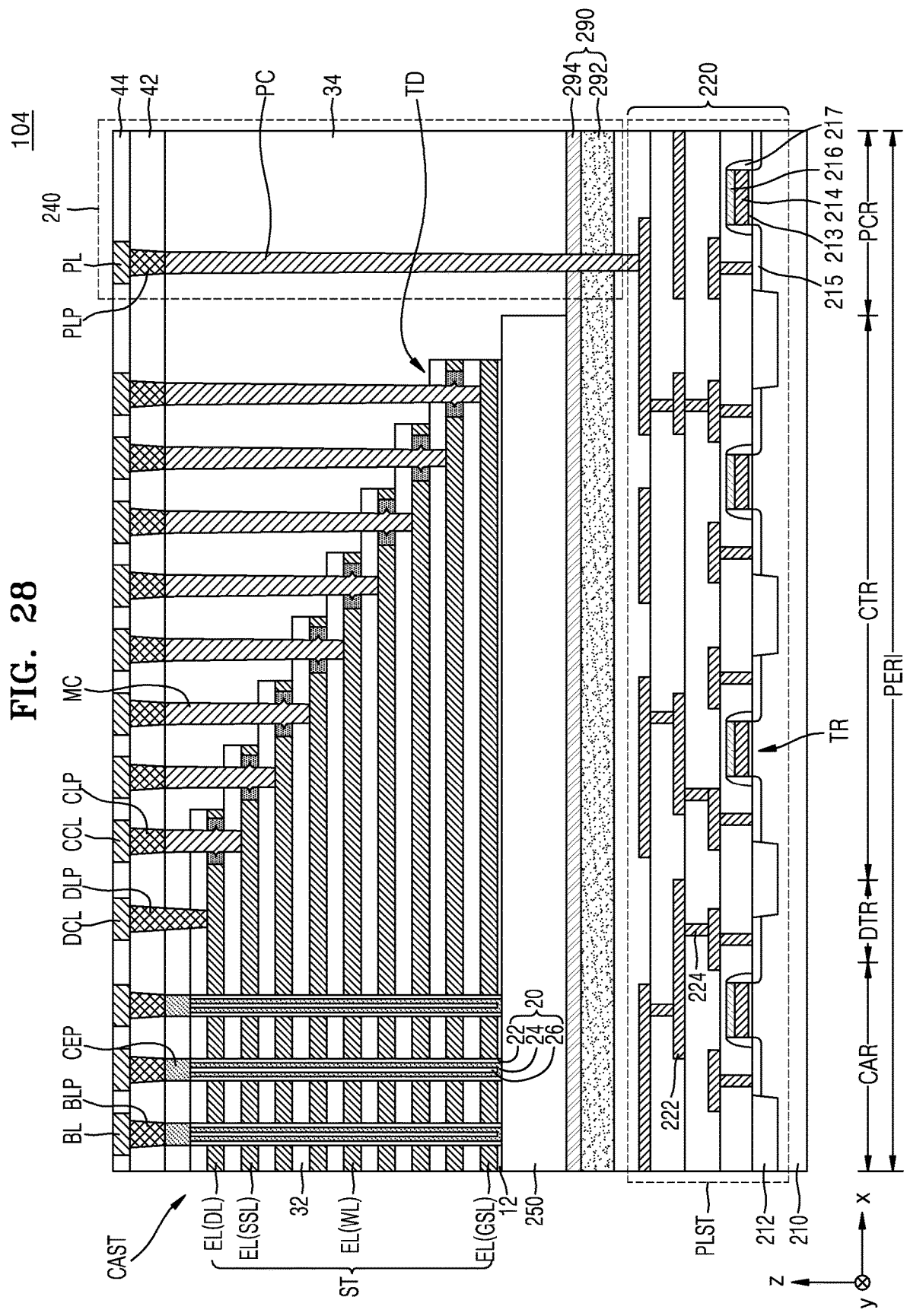
FIG. 28 is a cross-sectional view of a three-dimensional semiconductor device, according to an exemplary embodiment.

FIG. 28 is a cross-sectional view of a three-dimensional semiconductor device according to an exemplary embodiment.

Referring to FIG. 28, a three-dimensional semiconductor device 104 may include the peripheral circuit region PERI on a substrate 210. A peripheral circuit logic structure PLST may be arranged on the substrate 210 of the peripheral circuit region PERI. The peripheral circuit logic structure PLST may include transistors TR. Each transistor TR may be arranged in an active region defined by a device isolation layer 212. The transistors TR may be connected to lower wiring lines 222 and lower contacts 224 in a peripheral lower insulating layer 220. The peripheral lower insulating layer 220 may include a plurality of silicon oxide layers. Each transistor TR may include a peripheral circuit gate dielectric film 213, a peripheral circuit gate electrode 214, and a peripheral circuit source/drain region 215. In some embodiments, a peripheral circuit gate capping layer 216 may be arranged on a top surface of the peripheral circuit gate electrode 214, and a peripheral circuit gate spacer 217 may be arranged on side surfaces of the peripheral circuit gate electrode 214 and the peripheral circuit gate capping layer 216.

The cell array region CAR, the dummy contact region DTR, the contact region CTR, and a peripheral connection region PCR may be arranged on the peripheral circuit region PERI. Since configurations of the cell array region CAR, the dummy contact region DTR, and the contact region CTR are similar to those in the three-dimensional semiconductor device 100 shown in FIG. 4 except that a semiconductor layer 250 is arranged instead of the substrate (10 of FIG. 4), descriptions thereof will be omitted.

A peripheral upper insulating layer 290 may be arranged over the peripheral lower insulating layer 220 and the lower wiring lines 222 of the peripheral circuit region PERI. In some embodiments, the peripheral upper insulating layer 290 may include a low-K dielectric layer 292, which has a lower dielectric constant than a silicon oxide layer, and a porous layer 294. The porous layer 294 may be a material layer including a porous material. In some embodiments, the porous layer 294 may include silicon carbonitride (SiCN).

The semiconductor layer 250 may be formed on the peripheral upper insulating layer 290 of the cell array region CAR. The semiconductor layer 250 may not be arranged in the peripheral connection region PCR. The semiconductor layer 250 may include at least one selected from the group consisting of a single-crystal silicon layer, silicon-on-insulator (SOI), a silicon layer formed on a silicon germanium (SiGe) layer, a single-crystal silicon layer formed on an insulating layer, and a polysilicon layer formed on an insulating layer. The semiconductor layer 250 may be of a first conductivity type (for example, a p-type).

A cell array structure CAST may be arranged on the semiconductor layer 250 of the cell array region CAR. The cell array structure CAST may include: the stacked structure ST including the electrodes EL vertically stacked on the semiconductor layer 250, and the vertical structures 20 penetrating the stacked structure ST. An end of each of the vertical structures 20 may be connected to the semiconductor layer 250, and the cell pad CEP may be formed on the other end of each of the vertical structures 20.

The stacked structure ST may include the plurality of electrodes EL, and the electrode isolation insulating layers 32 between the vertically adjacent electrodes EL. The electrodes EL may include the ground select line GSL, the word lines WL, the string select line SSL, and the dummy select line DL, which are stacked on the semiconductor layer 250 in this stated order. The electrodes EL may have a stepwise structure near the peripheral connection region PCR.

A peripheral circuit connection structure 240, which is connected to the peripheral circuit logic structure PLST, may be arranged in the peripheral connection region PCR. The peripheral circuit connection structure 240 may include a peripheral circuit contact plug PC, a peripheral circuit landing plug PLP, and a peripheral circuit connection line PL. The peripheral circuit contact plug PC may penetrate the first insulating layer 34, the peripheral upper insulating layer 290, and the peripheral lower insulating layer 220 and be connected to the lower wiring lines 222. The peripheral circuit landing plug PLP may be arranged on the peripheral circuit contact plug PC. The peripheral circuit landing plug PLP may be connected to the peripheral circuit connection line PL.

In some embodiments, the peripheral circuit connection structure 240 may be connected to the bit line BL. In some embodiments, the peripheral circuit connection structure 240 may be connected to the contact connection line CCL. In some embodiments, the peripheral circuit connection structure 240 may be connected to the dummy connection line DCL.

Although not shown separately, since it is obvious to one of ordinary skill in the art that the configuration of the three-dimensional semiconductor device 100a, 100b, or 100c shown in FIGS. 5 to 7 is applied to the configurations of the cell array region CAR, the dummy contact region DTR, and the contact region CTR, descriptions thereof will be omitted.

Figure 29:
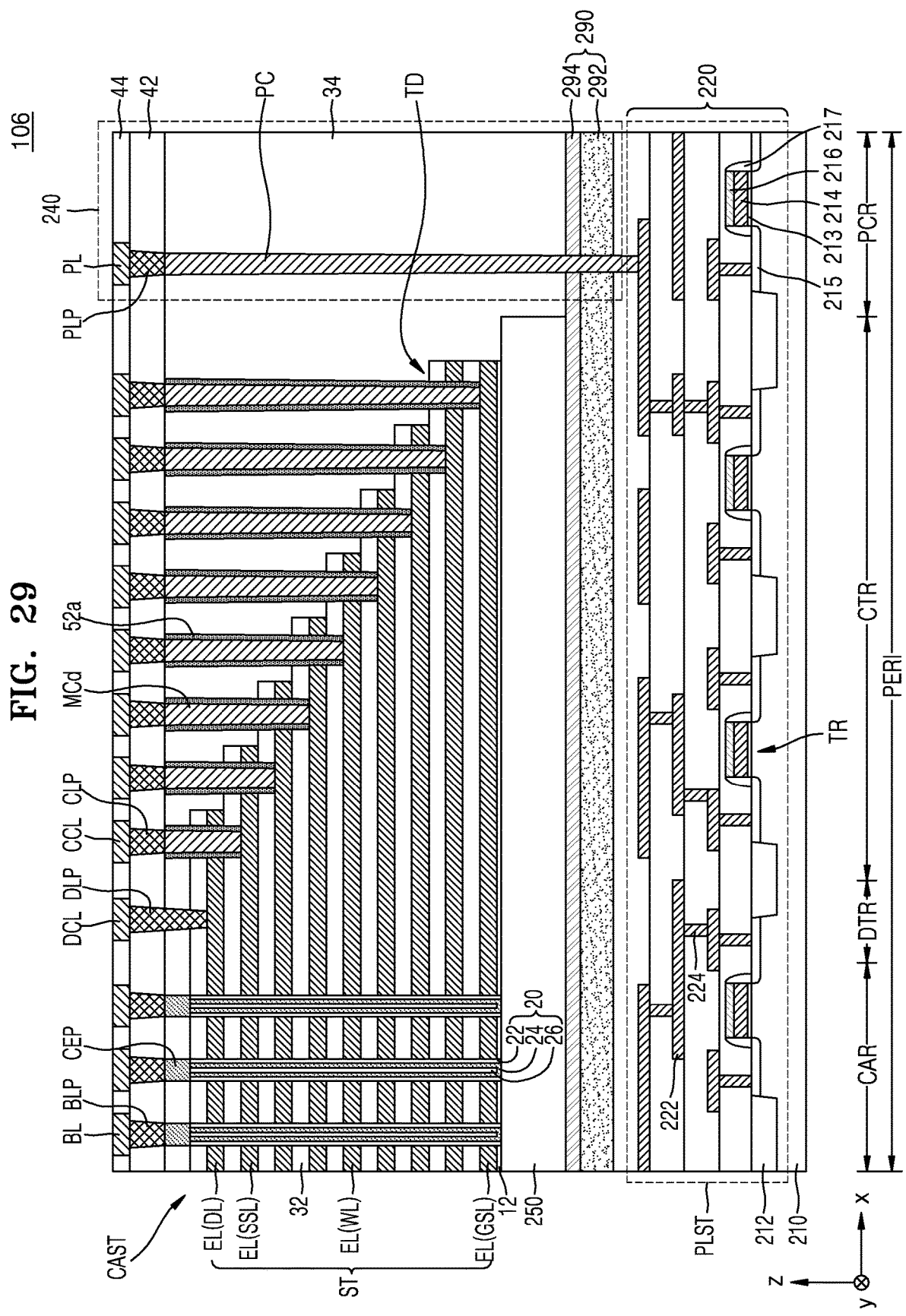
FIG. 29 is a cross-sectional view of a three-dimensional semiconductor device, according to an exemplary embodiment.

FIG. 29 is a cross-sectional view of a three-dimensional semiconductor device according to an exemplary embodiment. In descriptions with reference to FIG. 29, descriptions overlapping with the descriptions with reference to FIG. 28 may be omitted, and like components will be denoted by like reference numerals unless otherwise stated.

Referring to FIG. 29, a three-dimensional semiconductor device 106 may include the peripheral circuit region PERI on the substrate 210. The peripheral circuit logic structure PLST may be arranged on the substrate 210 of the peripheral circuit region PERI.

The cell array region CAR, the dummy contact region DTR, the contact region CTR, and the peripheral connection region PCR may be arranged on the peripheral circuit region PERI. Since the configurations of the cell array region CAR, the dummy contact region DTR, and the contact region CTR are similar to those in the three-dimensional semiconductor device 102 shown in FIG. 8 except that the semiconductor layer 250 is arranged instead of the substrate 10 of FIG. 8, descriptions thereof will be omitted.

The peripheral upper insulating layer 290 may be arranged over the peripheral lower insulating layer 220 and the lower wiring lines 222 of the peripheral circuit region PERI.

The semiconductor layer 250 may be formed on the peripheral upper insulating layer 290 of the cell array region CAR. The semiconductor layer 250 may not be arranged in the peripheral connection region PCR.

The cell array structure CAST may be arranged on the semiconductor layer 250 of the cell array region CAR. The cell array structure CAST may include: the stacked structure ST including the electrodes EL vertically stacked on the semiconductor layer 250, and the vertical structures 20 penetrating the stacked structure ST.

The stacked structure ST may include the plurality of electrodes EL, and the electrode isolation insulating layers 32 between the vertically adjacent electrodes EL. The electrodes EL may include the ground select line GSL, the word lines WL, the string select line SSL, and the dummy select line DL, which are stacked on the semiconductor layer 250 in this stated order.

The peripheral circuit connection structure 240, which is connected to the peripheral circuit logic structure PLST, may be arranged in the peripheral connection region PCR. The peripheral circuit connection structure 240 may include the peripheral circuit contact plug PC, the peripheral circuit landing plug PLP, and the peripheral circuit connection line PL. The peripheral circuit contact plug PC may penetrate the first insulating layer 34, the peripheral upper insulating layer 290, and the peripheral lower insulating layer 220 and be connected to the lower wiring lines 222. The peripheral circuit landing plug PLP may be arranged on the peripheral circuit contact plug PC. The peripheral circuit landing plug PLP may be connected to the peripheral circuit connection line PL.

While the concepts have been particularly shown and described with reference to embodiments thereof, it will be understood that various changes in form and details may be made therein without departing from the spirit and scope of the following claims.

What is claimed is:

1. A three-dimensional semiconductor device comprising:
a substrate having a cell array region, a contact region, and a dummy contact region between the cell array region and the contact region;
a stacked structure comprising a plurality of electrodes and a plurality of electrode isolation insulating layers, which are alternately stacked on the substrate in a vertical direction, and having a stepwise structure on the contact region;
a plurality of contact plugs in the contact region;
a contact landing plug on each contact plug; and
a dummy landing plug connected to an uppermost electrode of the plurality of electrodes in the dummy contact region,
wherein each electrode of the plurality of electrodes, except for the lowermost electrode, comprises a tread portion corresponding to a portion of the electrode that is not overlapped by any overlying ones of the plurality of electrodes,
wherein each of the plurality of contact plugs penetrates a tread portion of a corresponding upper electrode, is electrically insulated from the upper electrode, and
wherein a height of the dummy landing plug is greater than a height of the contact landing plug.

2. The three-dimensional semiconductor device according to claim 1, further comprising:
an insulating barrier layer between each of the contact plugs and the corresponding upper electrode penetrated thereby,
wherein the insulating barrier layer at least partially surrounds a side surface of the contact plug.

3. The three-dimensional semiconductor device according to claim 2, wherein each of the contact plugs has a plug protrusion extending in a horizontal direction into a corresponding insulating barrier layer.

4. The three-dimensional semiconductor device according to claim 2, wherein upper and lower surfaces of the insulating barrier layer contact the electrode isolation insulating layers.

5. The three-dimensional semiconductor device according to claim 2, further comprising:
contact spacers respectively surrounding side surfaces of the contact plugs.

6. The three-dimensional semiconductor device according to claim 5, wherein the contact spacers and the insulating barrier layer are formed of the same material.

7. The three-dimensional semiconductor device according to claim 1, wherein ends of two lowermost electrodes among the plurality of electrodes of the stacked structure are vertically aligned with each other in the contact region.

8. The three-dimensional semiconductor device according to claim 1, further comprising:
a bit line landing plug on each vertical structure,
wherein top surfaces of the bit line landing plug, the dummy landing plug, and the contact landing plug are on the same plane.

9. The three-dimensional semiconductor device according to claim 8,
wherein the bit line landing plug, the dummy landing plug, and the contact landing plug are formed of the same material.

10. A three-dimensional semiconductor device comprising:
a substrate having a cell array region and a contact region;
a stacked structure comprising a plurality of electrodes and a plurality of electrode isolation insulating layers, which are alternately stacked on the substrate in a vertical direction, and having a stepwise structure on the contact region, wherein ends of two lowermost electrodes among the plurality of electrodes in the contact region are vertically aligned with each other at a same position;

vertical structures penetrating the stacked structure in the cell array region, each of the vertical structures constituting a cell string comprising a plurality of select transistors;

contact plugs in the contact region;

a bit line landing plug on each vertical structure; and a dummy landing plug on an uppermost electrode of the plurality of electrodes comprised in the stacked structure, wherein for each pair of immediately neighboring electrodes of the plurality of electrodes including an upper electrode and a lower electrode below the upper electrode, a corresponding one of the contact plugs penetrates and is electrically insulated from the upper electrode, and wherein a height of the dummy landing plug is greater than a height of the bit line landing plug.

11. The three-dimensional semiconductor device according to claim 10, wherein top surfaces of the bit line landing plug, and the dummy landing plug are on the same plane.

12. The three-dimensional semiconductor device according to claim 10, wherein the bit line landing plug, and the dummy landing plug are formed of the same material.

13. The three-dimensional semiconductor device according to claim 10, further comprising:

an insulating barrier layer providing electrical insulation between the corresponding one of the contact plugs and the upper electrode penetrated thereby, wherein the insulating barrier layer at least partially surrounds a side surface of the corresponding one of the contact plugs.

14. The three-dimensional semiconductor device according to claim 10, wherein each contact plug has a plug protrusion horizontally extending into a corresponding insulating barrier layer.

15. The three-dimensional semiconductor device according to claim 14, wherein, for each contact plug, the plug protrusion extends from the contact plug toward the upper electrode penetrated by the contact plug.

16. A three-dimensional semiconductor device comprising:

a substrate;

a peripheral circuit region having a peripheral circuit logic structure on the substrate;

a cell array region, a contact region, and a peripheral connection region, the cell array region, the contact region, and the peripheral connection region being vertically arranged on the peripheral circuit region;

a stacked structure comprising a plurality of electrodes and a plurality of electrode isolation insulating layers, which are alternately stacked on the cell array region and the contact region in a vertical direction, and having a stepwise structure on the contact region;

vertical structures penetrating the stacked structure, each of the vertical structures on the cell array region constituting a cell string;

a plurality of contact plugs in the contact region;

a peripheral circuit contact plug;

a dummy contact region between the cell array region and the contact region;

a bit line landing plug on each vertical structure;

a contact landing plug on each contact plug; and a dummy landing plug connected to an uppermost electrode of the plurality of electrodes in the dummy contact region, wherein a height of the dummy landing plug is greater than a height of the bit line landing plug and a height of the contact landing plug, wherein the peripheral circuit contact plug is arranged in the peripheral connection region and is electrically connected to the peripheral circuit logic structure, wherein each electrode of the plurality of electrodes, except for the lowermost electrode, comprises a tread portion corresponding to a portion of the electrode that is not overlapped by any overlying ones of the plurality of electrodes, and wherein each of the plurality of contact plugs penetrates a tread portion of a corresponding upper electrode, is electrically insulated from the upper electrode.

17. The three-dimensional semiconductor device according to claim 16, wherein the peripheral circuit logic structure includes lower wiring lines, lower contacts and transistors, wherein the transistors are connected to the lower wiring lines, and the lower contacts, and wherein the peripheral circuit contact plug is connected the lower wiring lines.

18. The three-dimensional semiconductor device according to claim 16, wherein top surfaces of the bit line landing plug, the dummy landing plug, and the contact landing plug are on the same plane.

* * * * *